United States Patent
Kudo

(10) Patent No.: US 6,420,261 B2
(45) Date of Patent: *Jul. 16, 2002

(54) SEMICONDUCTOR DEVICE MANUFACTURING METHOD

(75) Inventor: Hiroshi Kudo, Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/386,148

(22) Filed: Aug. 31, 1999

(30) Foreign Application Priority Data

Aug. 31, 1998 (JP) ............................................ 10-245741

(51) Int. Cl.$^7$ ............................................... H01L 21/44
(52) U.S. Cl. ....................... 438/633; 438/638; 438/640; 438/678
(58) Field of Search .................. 438/640, 624, 438/633, 638, 678

(56) References Cited

U.S. PATENT DOCUMENTS 5,824,599 A * 10/1998 Schacham-Diamond et al. 438/678
5,976,972 A * 11/1999 Inohara et al. ............... 438/640
6,153,511 A   11/2000 Watatani ..................... 438/623

* cited by examiner

Primary Examiner—David Nelms
Assistant Examiner—Reneé R Berry
(74) Attorney, Agent, or Firm—Armstrong, Westerman & Hattori, LLP

(57) ABSTRACT

The dual damascene method having steps of; after a first insulating film, a first organic insulating film, a second insulating film, and a metal film are formed in sequence, a first opening having a wiring pattern is formed in the metal film, then a second opening having a via pattern is formed in the second insulating film, then the first organic insulating film is etched using the second insulating film as a mask, then the first insulating film and the second insulating film are etched simultaneously while using the metal film and the first organic insulating film as a mask, and then the first organic insulating film is etched while using the metal film as a mask, at this stage, a wiring recess is formed in the first organic insulating film and the second insulating film, and a via-hole is formed in the first insulating film.

25 Claims, 21 Drawing Sheets

SEMICONDUCTOR DEVICE MANUFACTURING METHOD

BACKGROUND OF THE INVENTION

1. Field of the Invention

The present invention relates to a semiconductor device manufacturing method and, more particularly, a semiconductor device manufacturing method including the step of forming wiring layers of a multilevel wiring structure and a via by using a dual damascene method.

2. Description of the Prior Art

In recent years, the width of the wiring is narrowed with the miniaturization of the semiconductor device and also the distance between the wirings becomes narrower. Therefore, wiring resistance is increased and also a parasitic capacitance due to the wirings is increased. This delays a signal speed and prevents a higher speed operation of the semiconductor device according to the scaling law.

Under such circumstances, in order to reduce the parasitic capacitance between the wirings and the wiring resistance, it is needed to check again the multilevel wiring forming method and the insulating material and the metal wiring material.

The insulating material with the small dielectric constant is effective to reduce the wiring capacitance. Also, selection of the metal wiring material is shifted from aluminum (Al) to copper (Cu) having the small resistivity to reduce the wiring resistance.

Because it is difficult to apply the conventional dry etching in working a copper film, the damascene method is employed to work the copper film. The damascene method can be roughly classified into the single damascene method and the dual damascene method.

According to the single damascene method, formation of the plug (via) used to connect the underlying wiring and the overlying wiring and formation of the wirings must be conducted by individual steps. According to the dual damascene method, the wirings and the plug can be formed simultaneously.

The multilayer structure of the wiring layers of the semiconductor device is advanced with the miniaturization. For example, the number of wirings comes up to six layers in the semiconductor device of 0.18 $\mu$m wiring width generation. In this case, the wiring structure can be formed by repeating similar steps twelve times (six wiring formation steps and six plug formation steps), for example, according to the single damascene method, whereas the wiring structure can be formed only by repeating similar steps six times according to the dual damascene method.

The reason why the number of steps employed in the dual damascene method is merely half of the single damascene method is that, as described above, the wirings and the plug can be formed simultaneously. Hence, the dual damascene method is advantageous to suppress a production cost and to increase a production efficiency.

In addition, since the contact resistance between the underlying wiring and the plug connected to this wiring is low if the dual damascene method is employed, a failure in contact between them can be avoided easily and reliability of the wiring can be enhanced.

The dual damascene method is set forth in, for example, Patent Application Publication (KOKAI) Hei 9-55429 and Patent Application Publication (KOKAI) Hei 10-112503 in which the dual damascene method is applied to the interlayer insulating film including the low dielectric constant insulating film.

To begin with, steps of forming the copper plug and the copper wiring structure by the dual damascene method which is set forth in Patent Application Publication (KOKAI) Hei 9-55429 are shown in FIGS. 1A to 1D.

First, as shown in FIG. 1A, a first silicon oxide film 2, an organic low dielectric constant film 3, and a second silicon oxide film 4 are formed in sequence on a silicon substrate 1. In this case, fluorocarbon polymer such as polytetrafluoroethylene is employed as material of the organic low dielectric constant film. Then, an opening 4a having a wiring profile is formed in the second silicon oxide film 4 by patterning the second silicon oxide film 4. Then, as shown in FIG. 1B, resist is formed on the second silicon oxide film 4 and the opening 4a. A plug window 5a is formed on a part of the opening 4a by exposing/developing the resist. The resultant resist is employed as a resist pattern 5. Then, as shown in FIG. 1C, a via-hole 6 is formed by etching the organic low dielectric constant film 3 and the first silicon oxide film 2 in sequence through the plug window 5a of the resist pattern 5. Then, as shown in FIG. 1D, a wiring recess 7 is formed by selectively etching the organic low dielectric constant film 3 by the oxygen plasma through the opening 4a of the second silicon oxide film 4. Then, although not particularly shown, copper is buried in the via-hole 6 and the wiring recess 7, whereby the plug and the wiring are formed at the same time.

Next, steps of forming the copper plug and the copper wiring structure by the dual damascene method which is set forth in Patent Application Publication (KOKAI) Hei 10-112503 are shown in FIGS. 2A to 2C.

First, as shown in FIG. 2A, wiring recesses are formed in a silicon oxide film 12 formed on a semiconductor substrate 11, and then underlying wirings 13 are buried in the recesses. Then, a low dielectric constant resin film 14 and a first photoresist film 15 with low sensitivity are formed in sequence on the silicon oxide film 12 and the underlying wirings 13. Then, a hole latent image 15a in the first photoresist film 15 is formed by exposing. Then, a second photoresist film 16 with high sensitivity is coated on the first resist film 15. A latent image 16a of a wiring is then formed by exposing the second photoresist film 16. A part of the wiring latent image 16a is formed to overlap with the hole latent image 15a. Then, as shown in FIG. 2B, the first photoresist film 15 and the second photoresist film 16 are developed successively, so that the wiring latent image 16a is removed to form a wiring window 16b and also the hole latent image 15a is removed to form a hole window 15b. After this, the first photoresist film 15, the second photoresist film 16, and the low dielectric constant resin film 14 are etched sequentially from the upper side, as shown in FIG. 2C. As a result, a vertical contact hole 17 and a wiring recess 18 are formed in the low dielectric constant resin film 14. The copper (not shown) is buried in the vertical contact hole 17 and the wiring recess 18 simultaneously. Such copper is used as the plug in the vertical contact hole 17 and also used as the wiring in the wiring recess 18.

The above prior arts have a few problems as follows.

In the steps as shown in FIG. 1A, when the photoresist 8 used for a patterning mask is removed by the oxygen plasma, the organic low dielectric constant film 3 made of hydrocarbon resin under the second silicon oxide film 4 is etched into a wiring profile by the oxygen plasma. Therefore, pattern precision of the via-hole formed in the second silicon oxide film 4 is degraded. This is because chemical properties of the low dielectric constant organic material containing the hydrocarbon approximate the photoresist 8 and thus only the photoresist 8 cannot be removed selectively.

In this case, the reason why the hydrocarbon resin is employed as the organic low dielectric constant film is that the hydrocarbon resin is superior to the fluorocarbon polymer in adhesiveness for the silicon oxide film.

In addition, in the steps shown in FIGS. 2A to 2C, three different resin materials of the low dielectric constant resin film 14, the first photoresist film 15, and the second photoresist film 16 must be etched at the same etching rate. However, respective etching rates of these resin materials are different depending upon the width of the wiring recess 18 and the diameter of the vertical contact hole 17. Therefore, if the wiring recesses each having a different profile or width, or the vertical contact holes 17 each having a different diameter are to be formed in the same layer, it is difficult to etch these resin materials while controlling respective layers to coincide with their designed dimensions.

SUMMARY OF THE INVENTION

It is an object of the present invention to provide a semiconductor device manufacturing method including an interlayer insulating film patterning step which is able to form a wiring recess and a hole with good precision even when hydrocarbon resin is employed as a low dielectric constant film.

According to an aspect of the present invention, after a first insulating film, an organic insulating film, a second insulating film, and a metal film are formed in sequence over a substrate, an opening having a wiring pattern is formed in the metal film by the photolithography, then an opening having a via pattern profile is formed in the second insulating film by the photolithography, then the organic insulating film is etched using the second insulating film as a mask, then the first insulating film and the second insulating film are etched simultaneously while using the metal film and the organic insulating film as a mask, and then the organic insulating film is etched while using the second insulating film as a mask. At this stage, a wiring recess is formed in the organic insulating film and the second insulating film, and a via-hole is formed in the first insulating film.

Accordingly, since the organic insulating film can be protected by the second insulating film in removing the resist which is employed to form the opening in the metal film, the organic insulating film is never etched by the resist removing etchant.

In addition, when the underlying organic insulating film is etched by using the second insulating film as a mask, the resist on the second insulating film can be removed simultaneously with the etching of the organic insulating film. Thereby, there is no need that the resist should be removed solely, and the underlying organic insulating film which is exposed is not badly affected at all in removing the resist. Accordingly, the wiring recess and the via can be formed with high precision by applying not only fluorocarbon polymer but also hydrocarbon resin as constituent material of the organic insulating film.

Furthermore, since the first insulating film, the organic insulating film, and the second insulating film are sequentially etched under the optimum condition, the via-hole or the wiring recess can be formed in these films with high precision.

According to another aspect of the present invention, after the first insulating film, the organic insulating film, and the second insulating film are formed in sequence, an opening having a via pattern profile is formed in the second insulating film by the photolithography, then an opening having the via pattern profile is formed in the organic insulating film through the opening of the second insulating film, then an opening having a wiring pattern profile is formed in the second insulating film by the photolithography and at the same time an opening having the via pattern profile is formed by etching the first insulating film using the organic insulating film as a mask, and then an opening having the wiring pattern profile is formed by etching the organic insulating film while using the second insulating film as a mask.

In this manner, both the step of removing the resist used to form the opening and the step of forming the opening having the via pattern profile in the organic insulating film while using the second insulating film as a mask can be executed simultaneously by forming the opening having the via pattern profile in the second insulating film. Therefore, the patterning of the underlying organic insulating film into the unnecessary profile in removing the resist can be avoided. In addition, the organic insulating film is never etched into the unnecessary size in removing the resist formed on the second insulating film, so that the precision of the opening in the organic insulating film is never degraded.

Moreover, after the opening having the wiring pattern profile is formed in the second insulating film and then the opening having the via-hole profile is formed in the underlying organic insulating film, these opening profiles are transferred sequentially onto the insulating films positioned below them. Therefore, the wiring recess and the via-hole can be formed in the first insulating film, the second insulating film and the organic insulating film. As a result, the first insulating film, the second insulating film, and the organic insulating film can be etched individually under their optimum conditions, so that the wiring recess and the via-hole can be formed with high precision.

As described above, since it is possible to apply the dual damascene method to the multilevel wiring formation which employs the copper wiring and the low dielectric constant organic insulating film without selection of material for the organic insulating film, performance, reliability, and production efficiency of the semiconductor device can be improved.

The underlying organic insulating film may be interposed between the first insulating film and the second insulating film. The etching of the underlying organic insulating film may be carried out simultaneously when the overlying organic insulating film is etched.

According to still another aspect of the present invention, after the first insulating film and the second insulating film have been formed in sequence over the substrate, the opening having the via-hole pattern profile is formed in the first insulating film and the second insulating film by using the first photoresist, and then the opening having the wiring pattern profile is formed by etching the second insulating film and the upper portion of the first insulating film by using the second photoresist.

In this way, if the organic insulating material is adopted as the first insulating film, both the step of removing the resist used to form the opening and the step of forming the opening having the via pattern profile in the organic insulating film while using the second insulating film as a mask can be executed simultaneously by forming the opening having the via pattern profile in the second insulating film. Therefore, the first insulating film formed of the underlying organic insulating material is never etched into the unnecessary size in removing the first resist, so that the precision of the opening in the organic insulating film is never degraded.

Accordingly, when the dual damascene method is applied to the multilevel wiring formation which employs the copper wiring and the low dielectric constant organic insulating film without selection of organic insulating material constituting the first insulating film, performance, reliability, and production efficiency of the semiconductor device can be improved.

Furthermore, according to the present invention, since the via and the wirings are formed in the first insulating film formed of organic material, the wiring capacitance can be reduced effectively rather than the multilevel wiring structure in which the silicon oxide and the silicon nitride are employed. In addition, the exchange number of the etching gas which is employed to form the via-hole and the wiring recess in the insulating film can be reduced, and thus it is possible to form the multilevel wirings at low cost.

DETAILED DESCRIPTION OF THE PREFERRED EMBODIMENTS

Therefore, embodiments of the present invention will be explained with reference to the accompanying drawings hereinafter.

(First Embodiment)

Figure 1A:
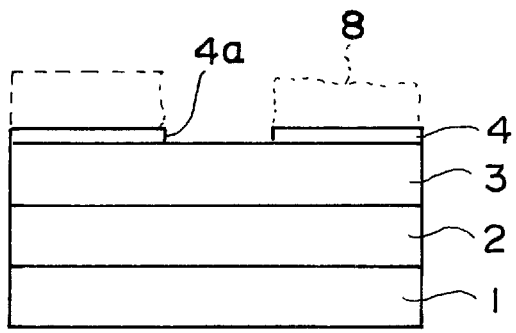
FIGS. 1A to 1D are sectional views showing steps of forming a multilevel wiring structure by the dual damascene method in the first prior art respectively.
Figure 1B:
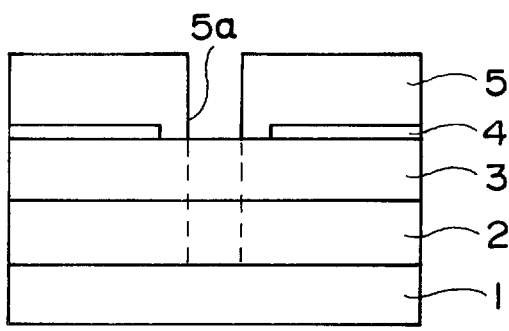
Figure 1C:
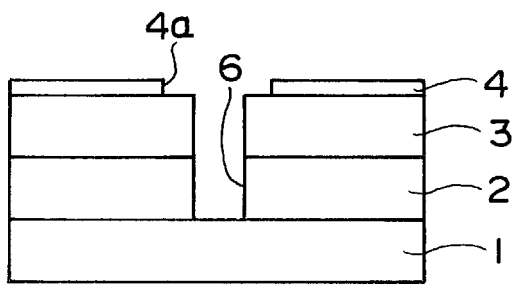
Figure 1D:
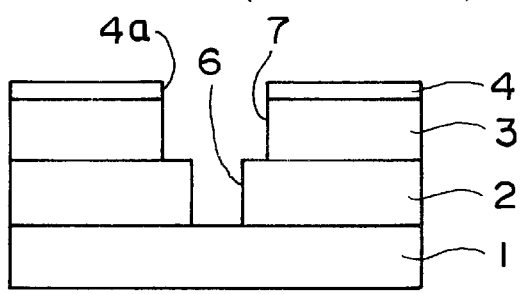
Figure 2A:
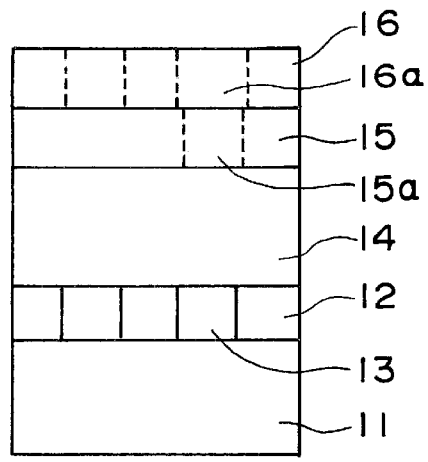
FIGS. 2A to 2C are sectional views showing steps of forming a multilevel wiring structure by the dual damascene method in the second prior art respectively.
Figure 2B:
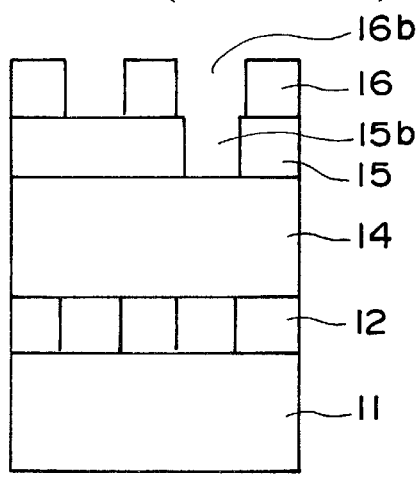
Figure 2C:
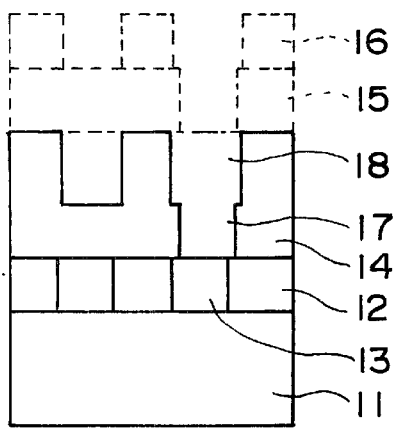
Figure 3A:
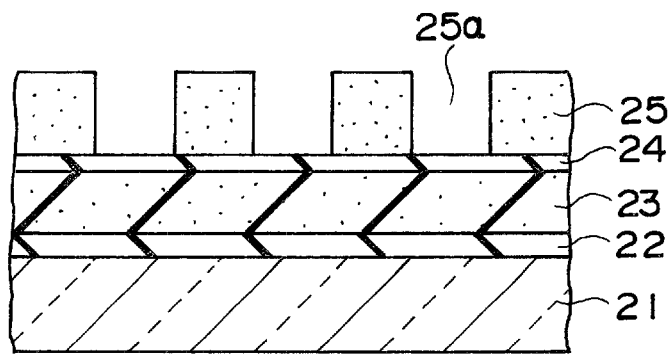
FIGS. 3A to 3P are sectional views showing steps of forming a multilevel wiring structure by a dual damascene method according to a first embodiment of the present invention respectively.
Figure 3B:
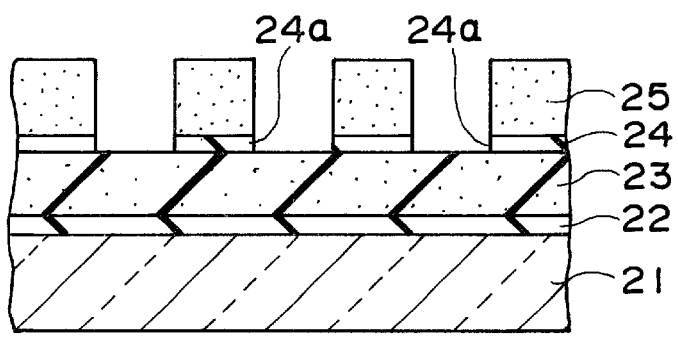
Figure 3C:
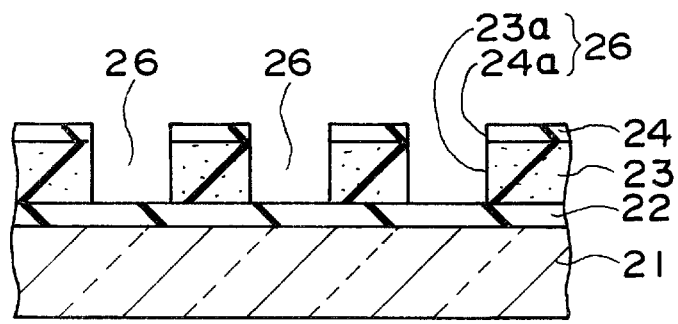
Figure 3D:
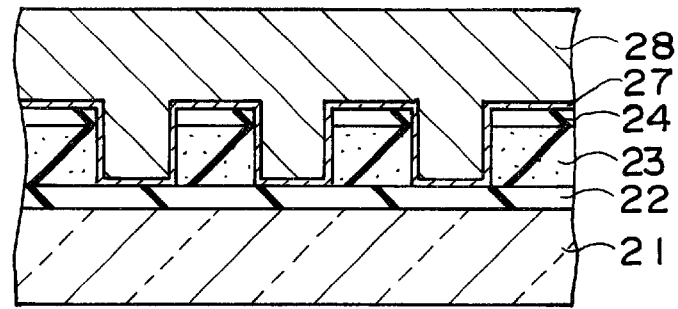
Figure 3E:
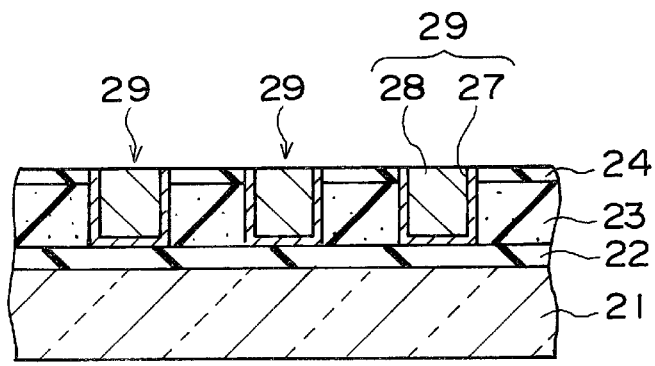
Figure 3F:
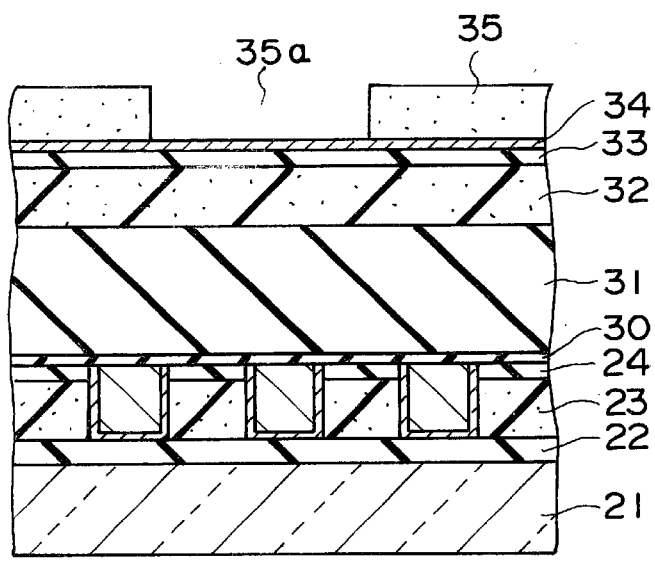
Figure 3G:
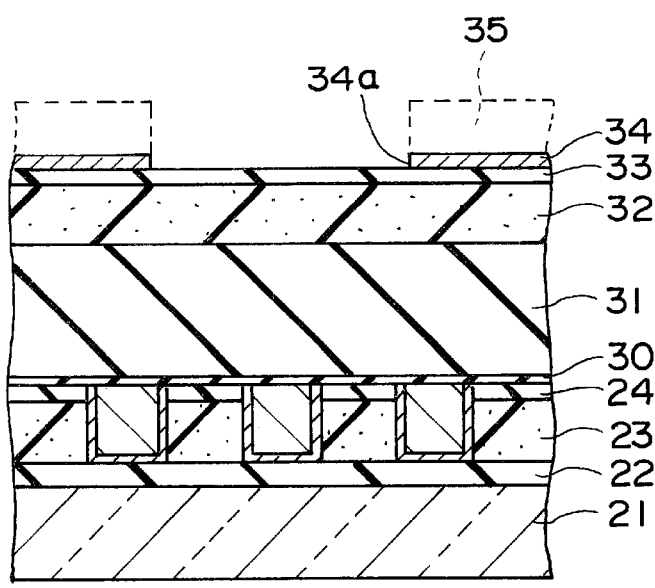
Figure 3H:
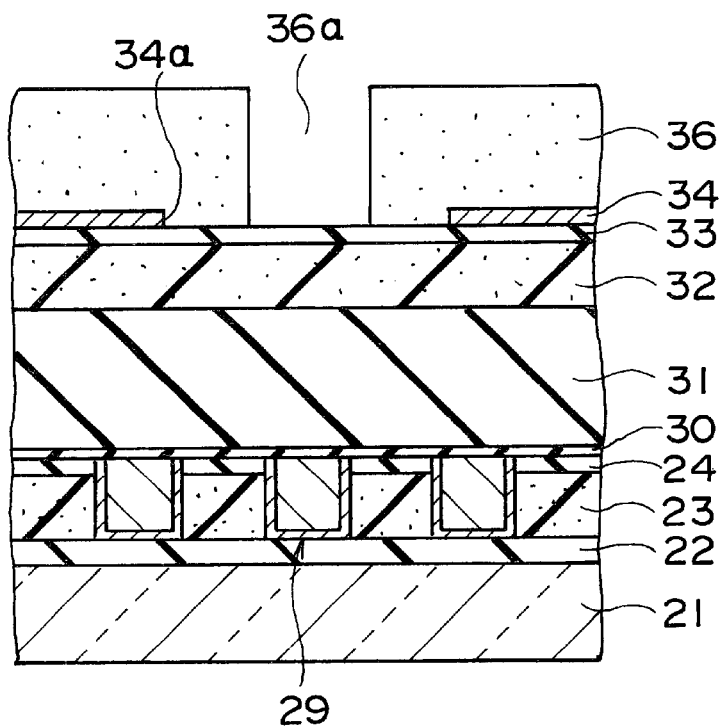
Figure 3I:
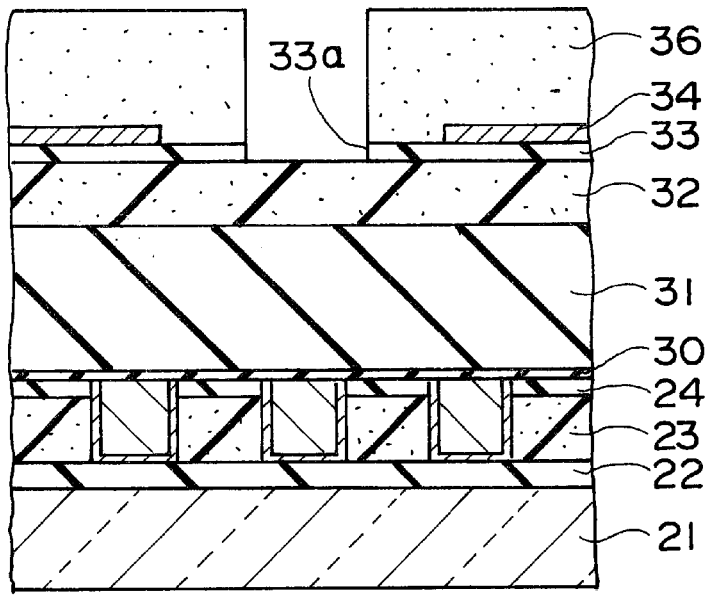
Figure 3J:
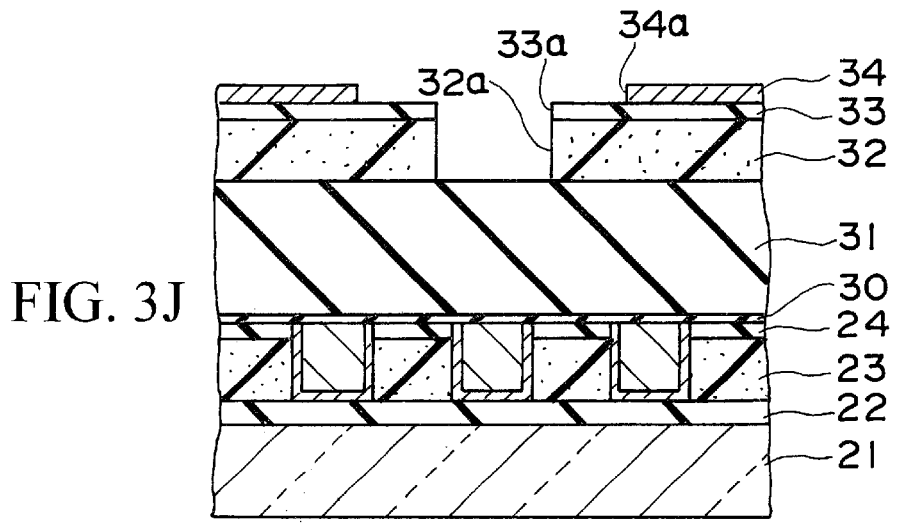
Figure 3K:
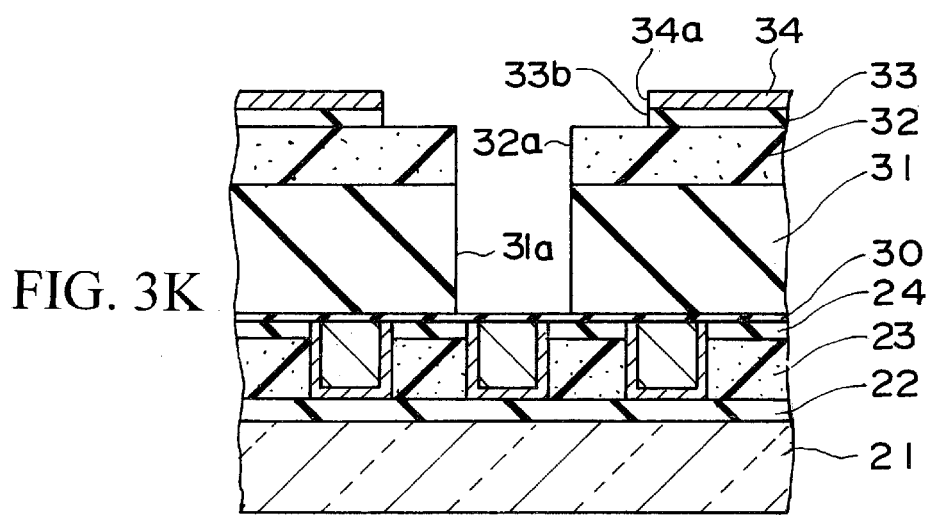
Figure 3L:
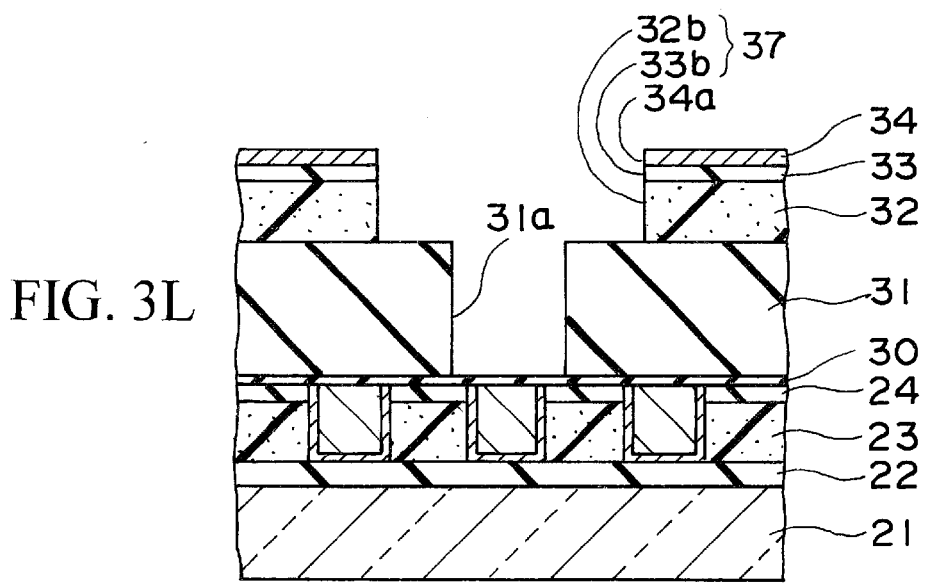
Figure 3M:
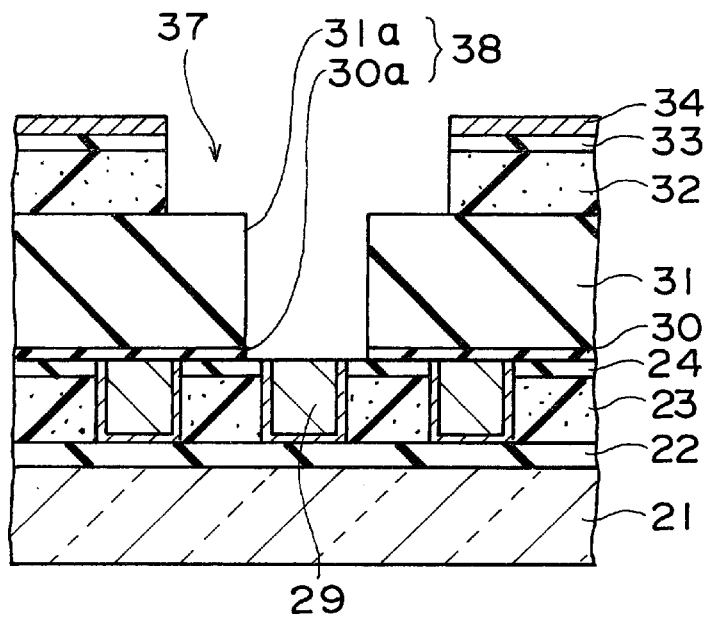
Figure 3N:
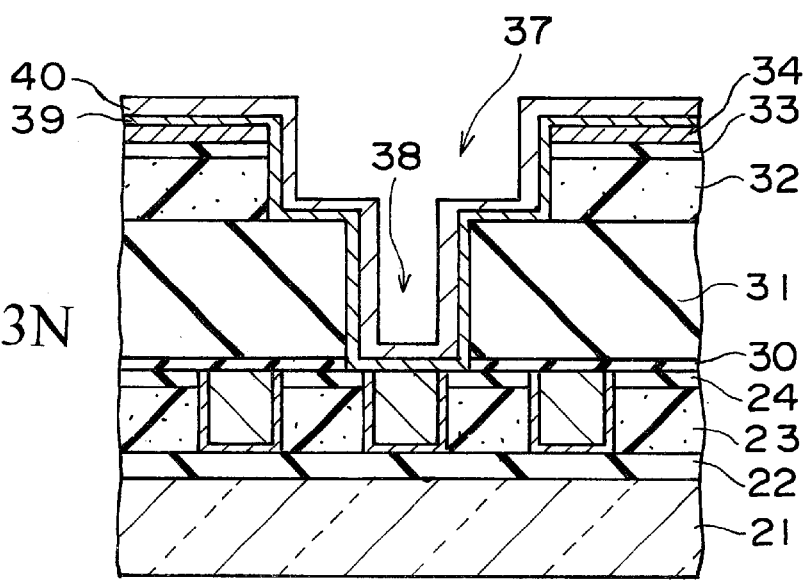
Figure 3O:
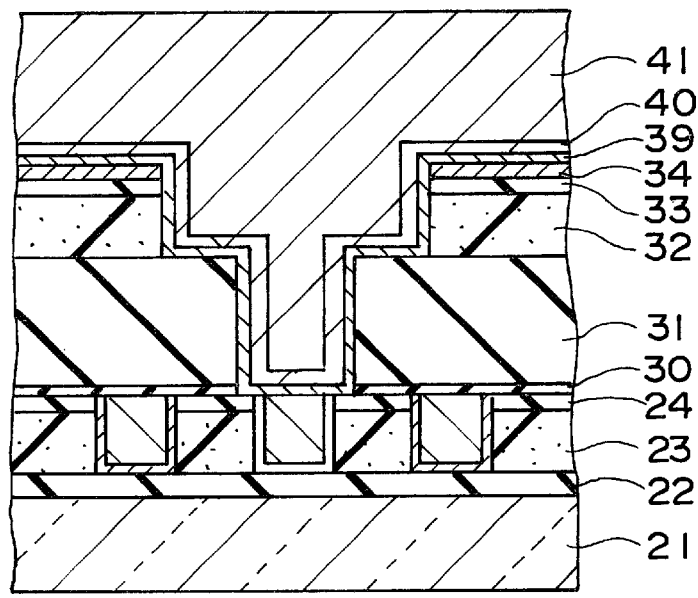
Figure 3P:
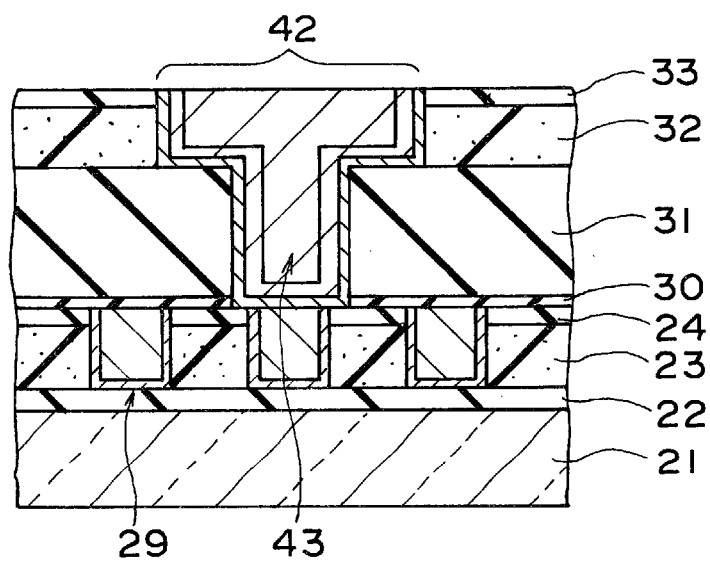

FIGS. 3A to 3P show steps of forming wirings of a semiconductor device by a dual damascene method according to a first embodiment of the present invention.

First, a step of forming an underlying wiring layer will be explained with reference to FIGS. 3A to 3D.

FIG. 3A shows the structure in which a first silicon oxide film ($SiO_2$ film) 22, a first organic insulating film 23, a second silicon oxide film 24, and a photoresist film 25 are formed on a silicon substrate 21.

The first silicon oxide film 22 and the second silicon oxide film 24 are formed by the plasma CVD method to have a thickness of 200 nm and a thickness of 100 nm respectively.

Then, the first organic insulating film 23 is formed by coating the low dielectric constant material, for example, FLARE2.0 (product name) manufactured by AlliedSignal, by the spin coating to have a thickness of 400 nm. The FLARE2.0 (product name) is aromatic polymer whose dielectric constant is 2.8 which is lower than the dielectric constant of the $SiO_2$ film and whose heat resistance is more than 400° C. The FLARE2.0 (product name) is employed as the first organic insulating film 23 herein, hydrocarbon polymer such as SiLK (product name) manufactured by The Dow Chemical Co., etc. may be employed. Also, other hydrocarbon containing resin, fluorocarbon polymer, and the like may be employed as the first organic insulating film 23.

The photoresist film 25 is photosensitive polymer. Windows 25a for wiring pattern are formed by exposing/developing the photoresist film 25.

Then, as shown in FIG. 3B, openings 24a each having a wiring pattern profile are formed by etching the second silicon oxide film 24 through the windows 25a of the photoresist film 25. The etching of the second silicon oxide film 24 is carried out by the plasma etching method using a $CF_4$ gas, a $CH_2F_2$ gas, and an Ar gas. Since such etching gas belongs to a fluorocarbon group, the second silicon oxide film 24 is etched selectively to thus form the wiring openings 24a, nevertheless the first organic insulating film 23 under the second silicon oxide film 24 is seldom etched.

Then, as shown in FIG. 3C, with the use of the plasma etching method, openings 23a for wiring pattern profiles are formed by removing the part of the first organic insulating film 23, which is exposed from the wiring openings 24a of the second silicon oxide film 24.

The etching of the first organic insulating film 23 is conducted in the atmosphere into which an $O_2$ gas and the Ar gas are introduced. In this case, since the etchant is composed of the oxygen, the first organic insulating film 23 and the photoresist film 25 can be etched selectively with respect to the $SiO_2$ films 22, 24, but the $SiO_2$ film 24 cannot be etched. However, since the photoresist film 25 is etched by the oxygen, the photoresist film 25 can be removed simultaneously with the etching of the first organic insulating film 23.

A first wiring recess 26 consists of the opening 24a of the second silicon oxide film 24 and the opening 23a of the first organic insulating film 23, which are formed by the above patterning processes.

In the following steps, the etching gases similar to the above are employed in respective etchings of the organic insulating film and the $SiO_2$ film.

The opening 23a of the first organic insulating film 23 and the opening 24a of the second silicon oxide film 24 are overlapped vertically with each other, and are used as the first wiring recess 26.

Then, as shown in FIG. 3D, a first barrier metal film 27 made of TiN or TaN as a refractory metal is formed in the first wiring recess 26 and on the second silicon oxide film 24 by the sputtering to have a thickness of 50 nm. Then, a first copper (Cu) film 28 is similarly formed on the first barrier metal film 27 by the sputtering to have a thickness of 800 nm.

Because unevenness is caused on an upper surface of the first Cu film 28, the annealing process is applied to the first Cu film 28 for five minutes in the hydrogen gas atmosphere of 400° C. and 0.1 Torr in order to planarize the upper surface. After this annealing process, the first Cu film 28 can be buried completely in the first wiring recess 26.

Subsequently, as shown in FIG. 3E, the first Cu film 28 and the first barrier metal film 27 are polished by using the chemical mechanical polishing (CMP) method. Thus, the first Cu film 28 and the first barrier metal film 27 remain only in the first wiring recess 26, and they are employed as a first wiring 29.

Then, as shown in FIG. 3F, a plurality of insulating film, metal film, etc., to be described in the following, are formed on the first wirings 29 and the second silicon oxide film 24.

More particularly, a 50 nm thick silicon nitride film 30 and a 600 nm thick third silicon oxide film 31 are formed by the plasma CVD method on the first wirings 29 and the second silicon oxide film 24. Then, a second organic insulating film 32 of 400 nm thickness is formed by the spin coating on the third silicon oxide film 31. In this case, any one of above materials employed for the first organic insulating film 23 may be selected as the second organic insulating film 32. In turn, a fourth silicon oxide film 33 of 100 nm thickness is formed on the second organic insulating film 32 by the plasma CVD method. Then, an intermediate metal film 34 made of TiN is formed on the fourth silicon oxide film 33 by the sputtering to have a thickness of 100 nm. As the intermediate metal film 34, it is possible to use other refractory metal or refractory metal compound, e.g., tantalum (Ta) or tantalum nitride (TaN), in addition to TiN.

After above film formations have been finished, a photoresist film 35 is coated on the intermediate metal film 34. Then, a window 35a which corresponds to a second wiring profile is formed by exposing/developing the photoresist 35. Then, a wiring opening 34a which has a profile corresponding to the second wiring is formed in the intermediate metal film 34 by the photolithography method using the photoresist film 35 as a mask. Such wiring pattern profile is not limited particularly.

Then, as shown in FIG. 3G, ashing of the photoresist film 35 is conducted by the oxygen plasma. At that time, since the second organic insulating film 32 is not exposed from the wiring opening 34a of the intermediate metal film 34, such second organic insulating film 32 is never badly influenced by the ashing.

Then, as shown in FIG. 3H, a photoresist film 36 is coated on the intermediate metal film 34 and in the wiring opening 34a. A window 36a which is positioned in the wiring opening 34a so as to oppose to a part of the first wirings 29 is formed in the photoresist film 36 by exposing/developing the photoresist film 36. The window 36a has a profile corresponding to a contact via.

Then, as shown in FIG. 3I, an opening 33a which corresponds to the contact via is formed by etching the fourth silicon oxide film 33 through the window 36a of the photoresist film 36.

After the etching has been completed, as shown in FIG. 3J, an opening 32a is formed by etching the second organic insulating film 32 through the opening 33a with the use of the plasma anisotropic etching using oxygen and argon. Upon this etching, an overall photoresist film 36 can be etched simultaneously and thus removed. Accordingly, a step of removing the photoresist film 36 independently can be omitted and in addition the second organic insulating film 32 is never etched unnecessarily.

Then, as shown in FIG. 3K, while using the intermediate metal film 34 as a mask, an opening 33b is formed by etching the fourth silicon oxide film 33 through the opening 34a with the use of the plasma etching using a fluorine gas. The second organic insulating film 32 is used as a mask in the course of this etching. The third silicon oxide film 31 formed under the second organic insulating film 32 is etched through the opening 32a of the second organic insulating film 32, whereby an opening 31a is formed in the third silicon oxide film 31.

Next, when the second organic insulating film 32 is etched by the oxygen plasma through the opening 34a of the intermediate metal film 34, such second organic insulating film 32 can be patterned into a wiring profile and thus a wiring opening 32b shown in FIG. 3L can be formed. The wiring opening 32b of the second organic insulating film 32 as well as the wiring opening 33b of the fourth silicon oxide film 33 is used as a second wiring recess 37.

Then, as shown in FIG. 3M, with using the third silicon oxide film 31 as a mask, an opening 30a is formed by etching the silicon nitride film 30 under the opening 31a by the plasma etching using a $C_4F_8$ gas and the $O_2$ gas.

The opening 30a of the silicon nitride film 30 and the opening 31a of the third silicon oxide film 31 are employed as a contact via-hole 38, and thus a part of the first wiring 29 is exposed thereunder.

Then, as shown in FIG. 3N, a second barrier metal film 39 made of TiN or TaN and having a thickness of 50 nm is formed by the sputtering along inner surfaces of the second wiring recess 37 and the contact via-hole 38 and an upper surface of the intermediate metal film 34. Then, a second copper film 40 is formed by the sputtering to have a thickness of 100 nm.

In turn, as shown in FIG. 3O, while employing the second copper film 40 as a seed layer, a third copper film 41 of 1500 nm thickness is formed on the second copper film 40 by the electrolytic plating method. Then, the third copper film 41 is annealed at 400° C. for thirty minutes in the hydrogen atmosphere. The annealing process is carried out to grow particles in the third copper film 41 and to enhance the reliability of the wirings.

Then, as shown in FIG. 3P, respective films from the third copper film 41 to the intermediate metal film 34 are polished in sequence by the CMP method, whereby these conductive films remain only in the second wiring recess 37 and the contact via-hole 38. Then, the conductive film in the second wiring recess 37 is used as a second wiring 42, and the conductive film remained in the contact via-hole 38 is used as a plug 43.

Accordingly, the dual damascene method according to the present invention has been finished, and then the process is shifted to a step of forming another wiring on the structure obtained above.

By the way, as described above, after the opening 34a having a profile corresponding to the second wiring is formed in the intermediate metal film 34, the second organic insulating film 32 formed thereunder is in no way exposed from the opening 34a because such second organic insulating film 32 is covered with the fourth silicon oxide film 33. As a result, the second organic insulating film 32 is never etched at the time when the photoresist film 35 used in patterning the intermediate metal film 34 is etched by the oxygen plasma. Hence, not only the fluorocarbon polymer but also the hydrocarbon containing resin can be employed as material constituting the second organic insulating film 32.

In addition, since the opening 32a is formed in the second organic insulating film 32 while using as a mask the fourth silicon oxide film 33 in which the opening 33a having a profile corresponding to the contact via-hole is formed, there is no situation that the second organic insulating film 32 is etched unnecessarily.

Also, as shown in FIG. 3J, the underlying inorganic film 31, the organic insulating film 32, the overlying inorganic film 33, and the intermediate metal film 34 are formed in sequence on the first wiring 29, then the opening 34a corresponding to the wiring profile is formed in the intermediate metal film 34, and then the opening 33a corresponding to the via-hole profile is formed in the overlying inorganic film 33. In this situation, the profile of the opening 33a corresponding to the via-hole is transferred onto the organic insulating film 32 and the underlying inorganic film 31 sequentially to form the openings 32a and 31a respectively. Then, the openings 33b, 32b are formed by transferring the opening 34a corresponding to the wiring profile onto the overlying inorganic film 33 and the organic insulating film 32 sequentially.

For this reason, since the optimal etching for the type of the film can be performed, the opening profiles can be formed in respective films with good precision.

In addition, if an increase in positional discrepancy of the patterns is caused when the photoresist film 36 is exposed/developed in the initial photolithography to form the via pattern in the steps shown in FIG. 3I, such photoresist film 36 can be removed by the oxygen plasma and then such steps are conducted newly again. This is because the fourth silicon oxide film 33 exists below the photoresist film 36 and therefore the second organic insulating film 32 formed under the fourth silicon oxide film 33 is not damaged at all. Accordingly, it is possible to work the via diameter according to the designed dimension without depending on the precision in the positional discrepancy.

In this case, the silicon containing insulating film such as an $Si_3N_4$ film, an SiON film, an SiC film, etc. may be employed in place of the above $SiO_2$ films. This is similarly true of the embodiments to be described hereinafter.

(Second Embodiment)

In the first embodiment, the intermediate metal film 34 is formed on the fourth silicon oxide film 33, and then the opening 34a for the second wiring is formed in the intermediate metal film 34. In a second embodiment of the present invention, a method of forming the second wiring recess 37 and the contact via-hole without the intermediate metal film 34 will be explained hereunder.

Figure 4A:
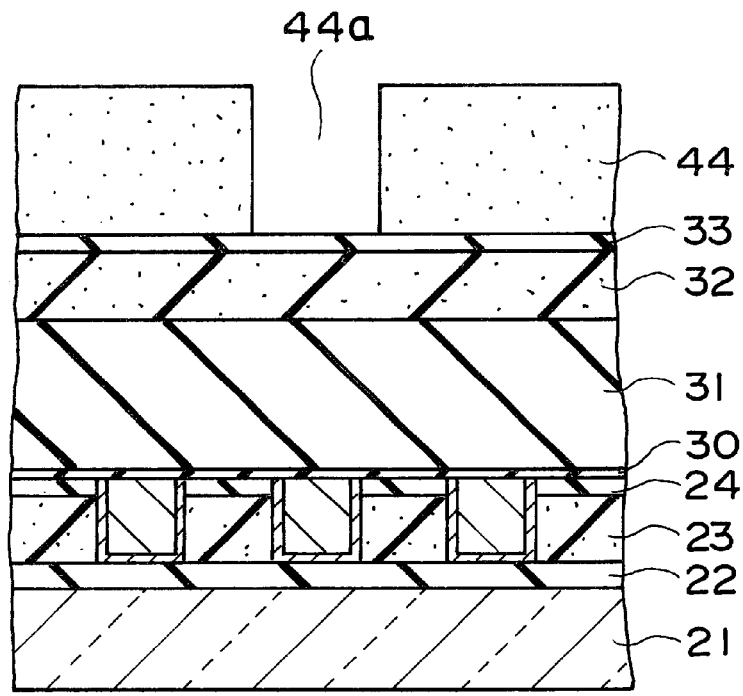
FIGS. 4A to 4G are sectional views showing steps of forming a multilevel wiring structure by a dual damascene method according to a second embodiment of the present invention respectively.

First, FIG. 4A shows the situation that the intermediate metal film 34 is not formed in the multilevel structure shown in FIG. 3F. Then, photoresist 44 is coated on the fourth silicon oxide film 33 in such situation. Then, a window 44a which is employed to form a contact via-hole is formed by exposing/developing the photoresist 44. The window 44a is positioned over a part of the first wirings 29.

Figure 4B:
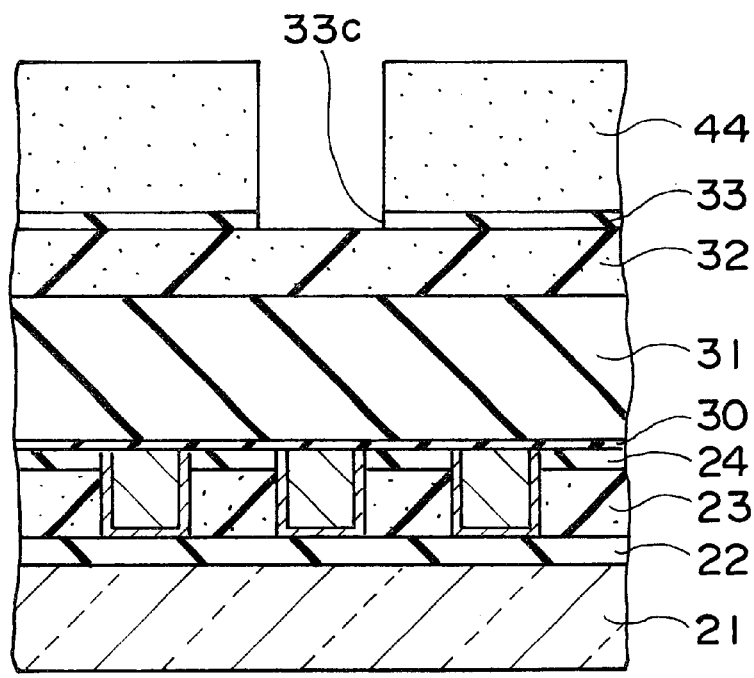

Then, as shown in FIG. 4B, an opening 33c is formed by etching the fourth silicon oxide film 33 through the window 44a of the photoresist 44.

Figure 4C:
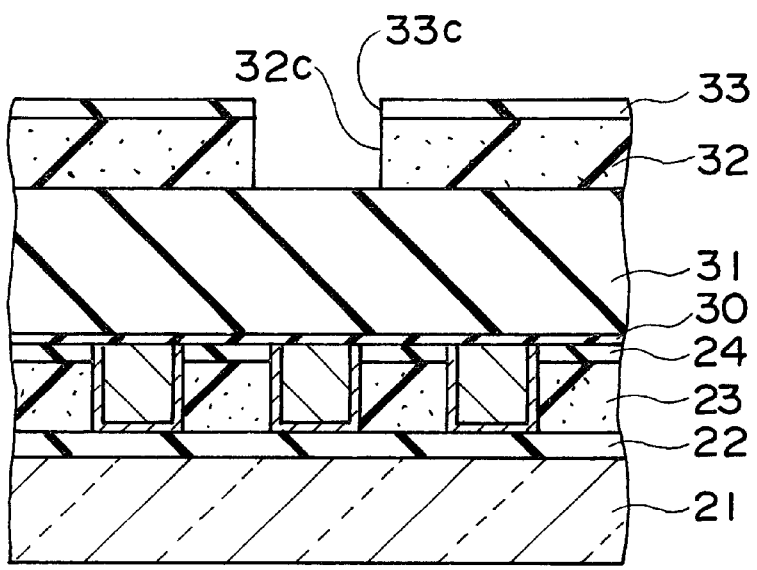

In turn, as shown in FIG. 4C, an opening 32c is formed in the second organic insulating film 32 by etching the second organic insulating film 32 through the window 44a of the photoresist 44 and the opening 33c of the fourth silicon oxide film 33. In this case, the plasma anisotropic etching method using the oxygen is employed in etching the second organic insulating film 32, whereby the photoresist 44 can be etched simultaneously and thus removed.

Figure 4D:
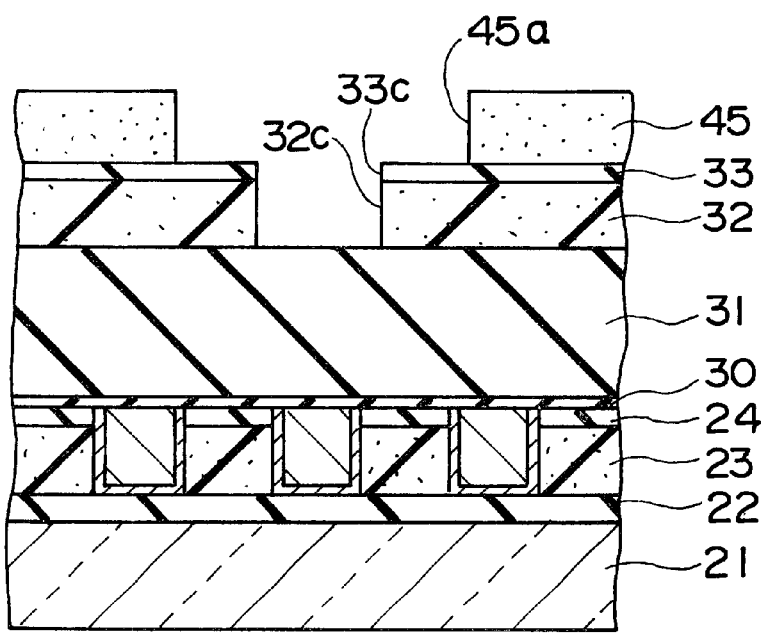

After this, as shown in FIG. 4D, photoresist 45 is formed on the fourth silicon oxide film 33. Then, a window 45a having a second wiring pattern is formed by exposing/developing the photoresist 45. In this event, the opening 32c of the second organic insulating film 32 is hardly expanded by the developer for developing the photoresist 45.

Figure 4E:
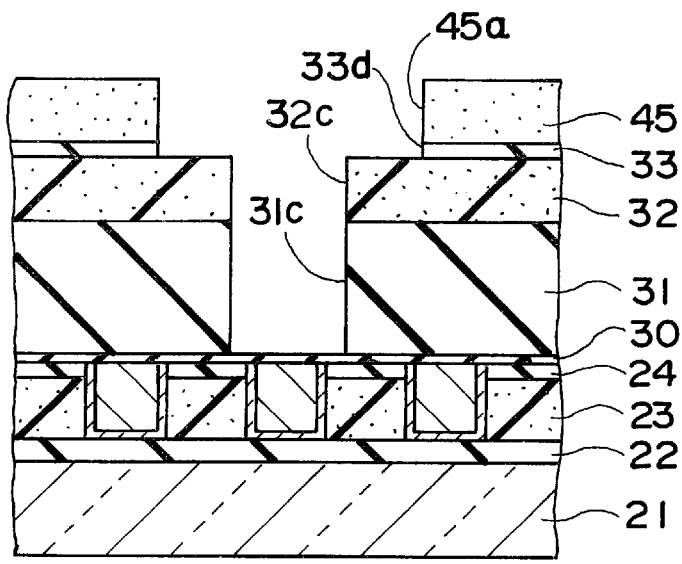

Next, as shown in FIG. 4E, when the fourth silicon oxide film 33 is etched through the window 45a of the photoresist 45, a wiring opening 33d is formed in the fourth silicon oxide film 33. In etching the fourth silicon oxide film 33, the third silicon oxide film 31 is also etched through the opening 32c of the second organic insulating film 32. As a result, an opening 31c serving as a contact via-hole 38 is formed in the third silicon oxide film 31.

Figure 4F:
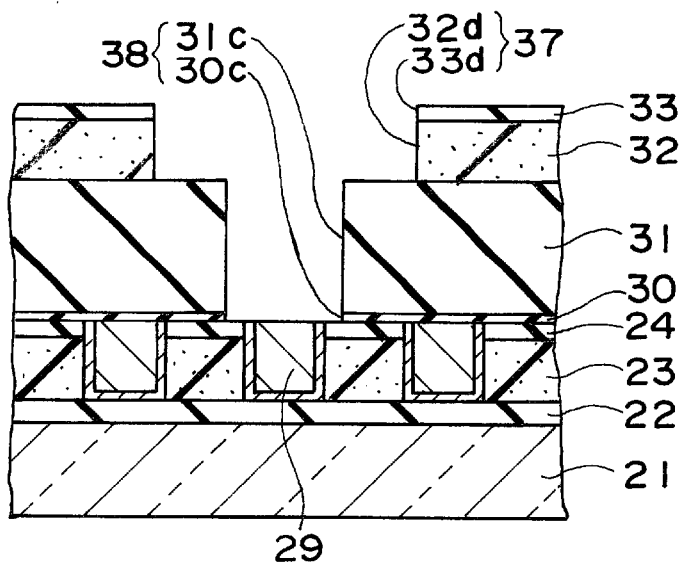

Then, the processes are advanced to various steps shown in FIG. 4F.

First, when the second organic insulating film 32 is etched through a wiring opening 33d of the fourth silicon oxide film 33, a wiring opening 32d is formed in the position to contain the opening 32c. In this case, the plasma anisotropic etching method using the oxygen containing gas is employed to etch the second organic insulating film 32, so that the photoresist 45 can be etched simultaneously and thus removed. The second wiring recess 37 is composed of the wiring opening 33d of the fourth silicon oxide film 33 and the wiring opening 32d of the second organic insulating film 32.

Then, an opening 30c serving as the contact via-hole 38 is formed by etching the silicon nitride film 30 through the opening 31c of the third silicon oxide film 31. Accordingly, a part of the first wiring 29 is exposed from the contact via-hole 38.

Figure 4G:
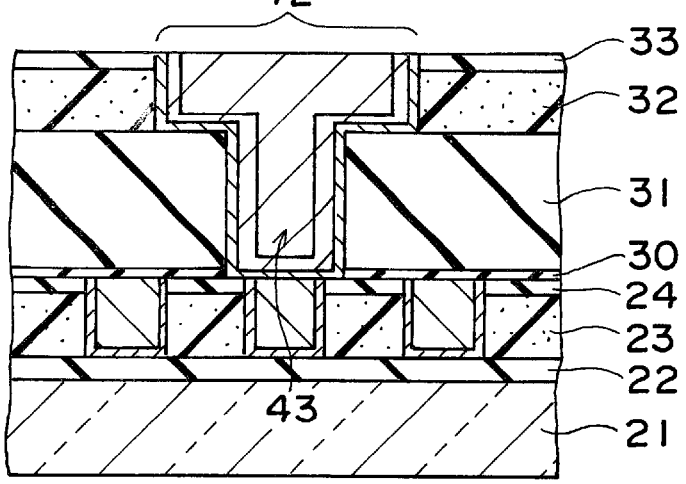

After this, as shown in FIG. 4G, via the steps similar to those in the first embodiment, a via 43 made of copper is buried in the contact via-hole 38 and also a second wiring 42 is buried in the second wiring recess 37.

In the second embodiment, unlike the first embodiment, the photoresist is employed instead of the metal film, as a mask to form the opening corresponding to the contact via in the fourth silicon oxide film 33.

For this reason, the step of forming the intermediate metal film 34 and the step of patterning the intermediate metal film 34 in the first embodiment can be omitted. Accordingly, the number of steps can be reduced rather than the first embodiment and thus the forming process can be made easy. However, the positional discrepancy caused in exposing the photoresist 45 in FIG. 4D has an influence upon diameters of the openings 30c, 31c, so that the diameters of the openings 30c, 31c are reduced by a displaced distance respectively. Therefore, the steps in the second embodiment are effective to form the wiring openings in the upper layer portion which does not so depend on the positional discrepancy precision in the photolithography.

In this second embodiment, unlike the prior art shown in FIG. 1, the opening 33d for forming the second wiring is formed after the opening 33c for forming the contact via-hole has been formed in the fourth silicon oxide film 33, and also the opening portions 32c, 32d are formed in the second organic insulating film 32 when two photoresist 44, 45 being coated on the fourth silicon oxide film 33 are removed respectively. Therefore, the second organic insulating film 32 is not badly affected at all when the photoresist formed on the fourth silicon oxide film 33 is removed by the oxygen plasma.

Figure 5:
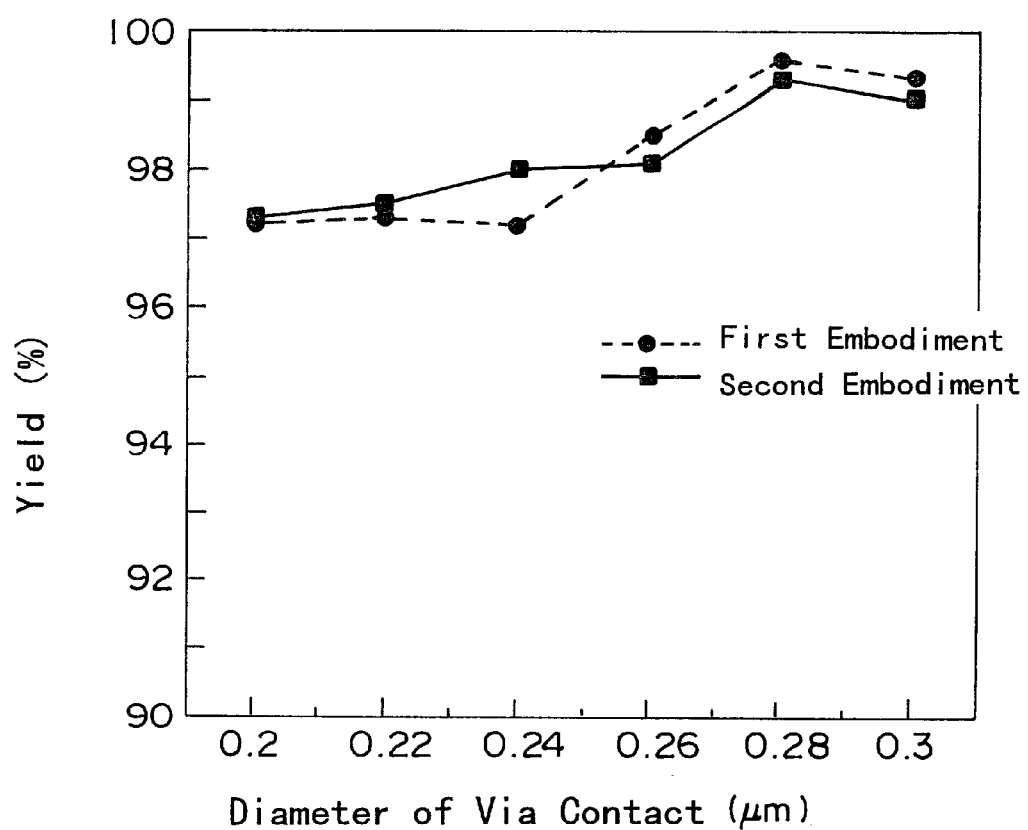
FIG. 5 is a view relationships between a diameter of a contact via formed by the first embodiment and the second embodiment and yield.

By the way, when relationships between the diameter of contact via formed by the above first and second embodiments and yield are examined experimentally, the results shown in FIG. 5 are obtained.

FIG. 5 shows the yield of the via plug which is obtained by measuring the contact resistance of the via plug and then deciding the via plug whose contact resistance exceeds a theoretical value by more than 10% as the defective. Such via plug connects the first layer wiring and the second layer wiring in the double-layered wirings which are formed according to the first embodiment and the second embodiment. The abscissa in FIG. 5 denotes the diameter of the via contact. As indicated by this result, the high yield in excess of 97% can be achieved at any via diameter.

Figure 6:
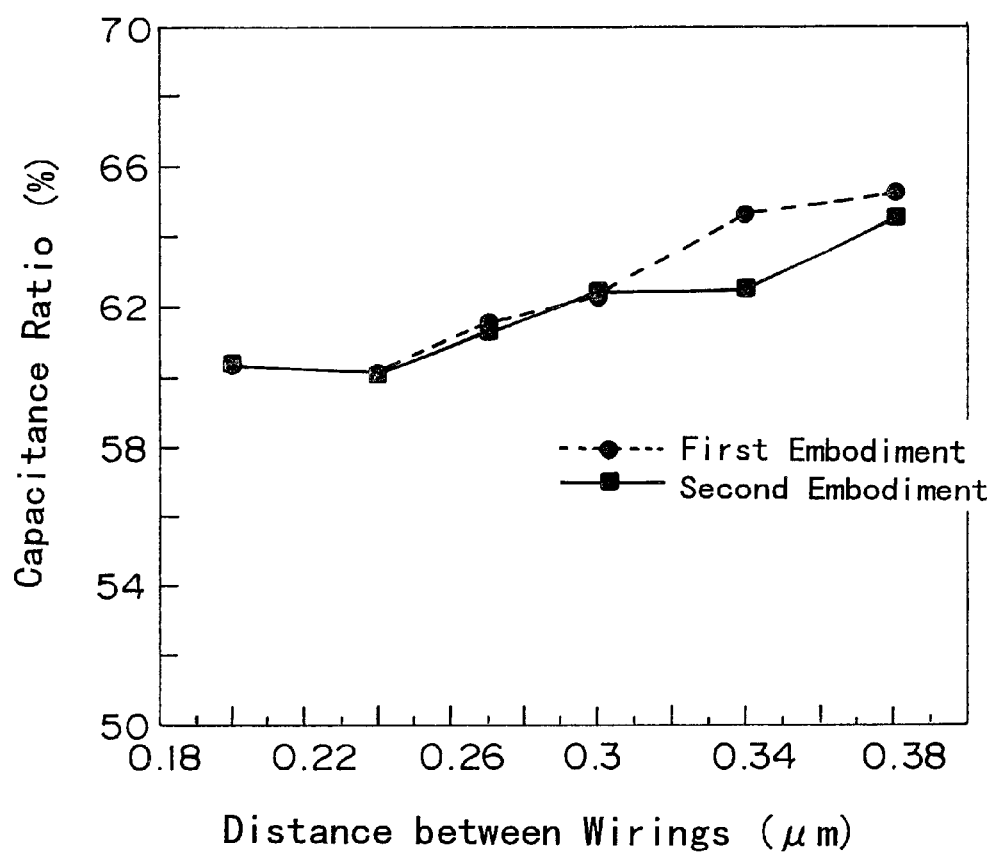
FIG. 6 is a view showing relationships between a distance between wirings formed by the first embodiment and the second embodiment and a capacitance ratio of the wirings, while comparing with the conventional relationship.

Next, when the lateral wiring distance and the capacitance ratio in the lateral direction are examined experimentally in the wirings which are formed according to the first embodiment and the second embodiment respectively, the results shown in FIG. 6 are obtained.

FIG. 6 shows the wiring capacitance ratio which is obtained by measuring the wiring capacitance in the same layer of the double-layered wirings, which are formed according to the first embodiment and the second embodiment, and then comparing it with the wiring capacitance generated when only the $SiO_2$ film is employed in the prior art. The abscissa in FIG. 13 denotes the distance between the wirings. As indicated by this result, the wiring capacitance ratio can be reduced in the range from 60% to 65%. This ratio is substantially equal to the ratio of the dielectric constant 4.3 of $SiO_2$ and the dielectric constant 2.8 of the organic insulating film, which shows the fact that the wirings have been formed satisfactorily.

(Third Embodiment)

In the first embodiment or the second embodiment, another organic insulating film may be formed between the silicon nitride film 30 and the third silicon oxide film 31.

Figure 7:
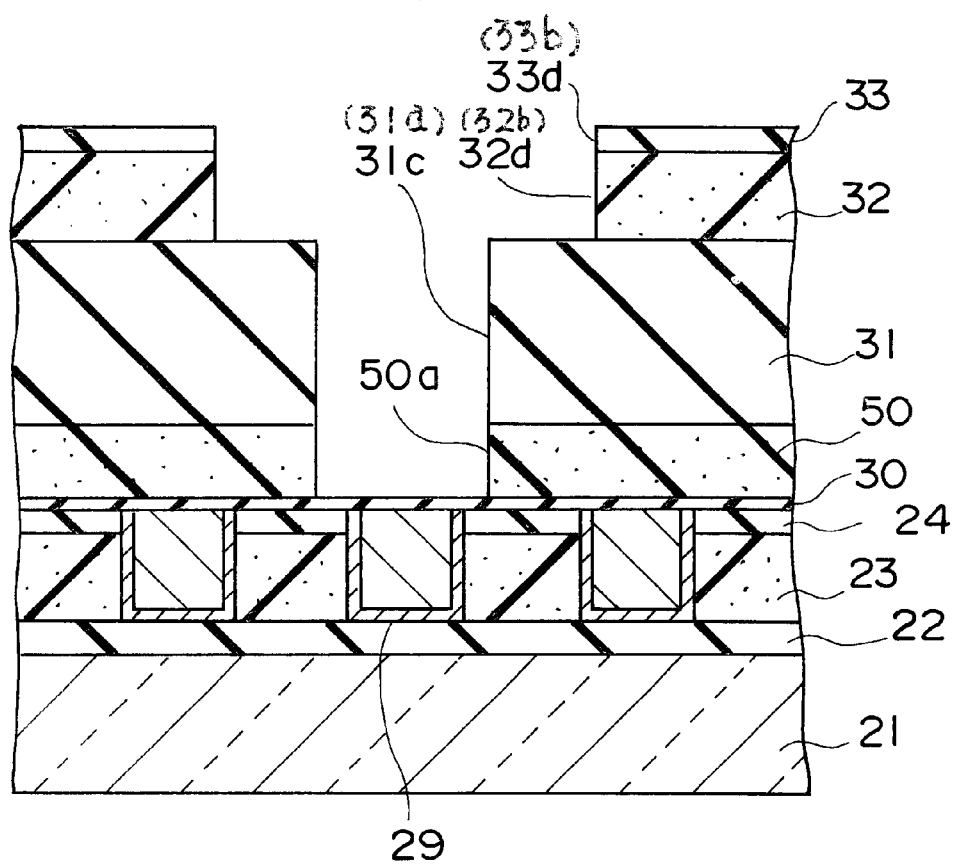
FIG. 7 is a sectional view showing a step of forming an opening on an organic insulating film by a dual damascene method according to a third embodiment of the present invention.

According to this, as shown in FIG. 7, before the opening is formed in the silicon nitride film 30, the openings 32b, 32d serving as the wiring recess are formed in the second organic insulating film 32 and simultaneously an opening 50a serving as the contact via-hole is formed in another organic insulating film 50 through the openings 31a, 31c of the third silicon oxide film 31.

After the opening 50a is formed, a part of the first wiring is exposed by etching the silicon nitride film 30 through the opening 50a and then the conductive film is buried in the via-hole and the wiring recess to thus form the via and the second wiring, like the first embodiment and the second embodiment.

In FIG. 7, the same reference symbols as those in FIG. 3L and FIG. 4E denote the like elements.

(Fourth Embodiment)

In the first embodiment and the second embodiment, the insulating layer into which the second copper wiring and the via (plug) are buried includes not only the organic insulating film but also the silicon oxide film. In a fourth embodiment, steps of forming a multilevel wiring structure in which the second copper wiring and the via (plug) are buried in the organic insulating film will be explained hereunder.

Figure 8A:
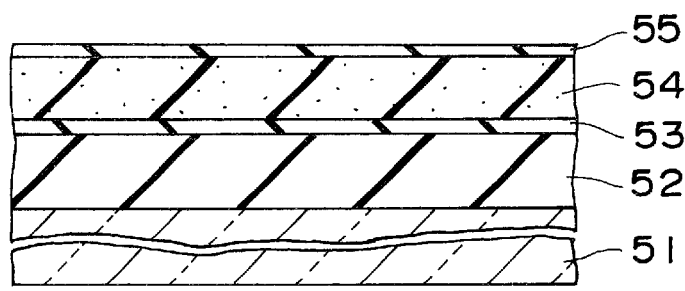
FIGS. 8A to 8P are sectional views showing steps of forming a multilevel wiring structure by a dual damascene method according to a fourth embodiment of the present invention respectively.

First, as shown in FIG. 8A, a first silicon oxide ($SiO_2$) film 52 and a first silicon nitride ($Si_3N_4$) film 53 are formed in order on a silicon substrate 51 by the plasma CVD method to have a thickness of 500 nm and a thickness of 50 nm respectively.

In the fourth embodiment, silane ($SiH_4$) and nitrogen monoxide ($N_2O$) are employed as a source gas to grow the silicon oxide film, and silane ($SiH_4$) and ammonia ($NH_3$) are employed as a source gas to grow the silicon nitride film. Also, like the first embodiment, the etching of the silicon oxide is carried out by the plasma etching method using a $CF_4$ gas or a mixed gas of $CH_2F_2$ and Ar. Also, the etching of the silicon nitride is carried out by the plasma etching method using a mixed gas of $CHF_3$ and Ar.

In addition, a first organic insulating film 54 of low dielectric constant is formed on the first silicon nitride film 53. For example, the first organic insulating film 54 may be formed by coating the low dielectric constant organic insulating material formed of the hydrocarbon group containing the aromatic material on the first silicon nitride film 53 via the spin coating to have a thickness of 300 nm, and then curing the organic insulating material for 30 minutes via the thermal annealing at the temperature of 400° C. in the nitrogen ($N_2$) atmosphere. As the low dielectric constant organic insulating material formed of the hydrocarbon group containing the aromatic material, for example, there is "SiLK" (product name) manufactured by The Dow Chemical Co. The dielectric constant of "SiLK" is about 2.7.

Then, a second silicon oxide film 55 is formed on the first organic insulating film 54 by the plasma CVD method to have a thickness of 100 nm.

Figure 8B:
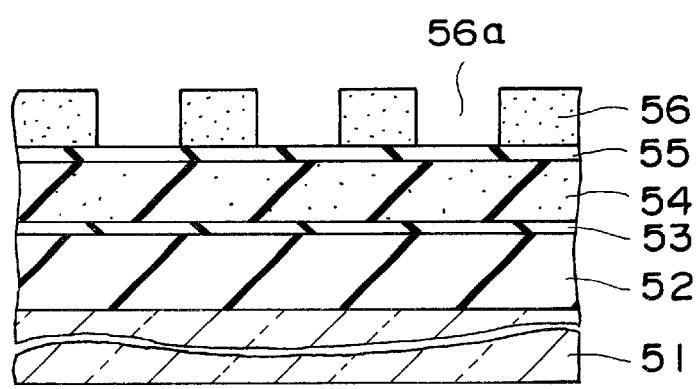

Then, as shown in FIG. 8B, photoresist 56 is coated on the second silicon oxide film 55. Windows 56a each having a wiring pattern are formed by exposing/developing the photoresist 56. In this embodiment, for example, a polyvinylphenol resin is employed as the photoresist 56.

Figure 8C:
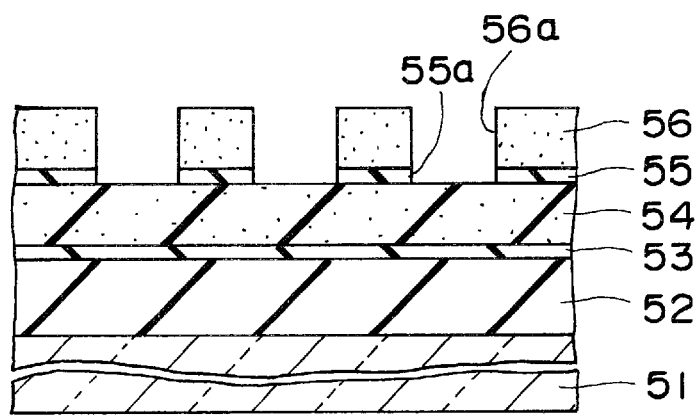
Figure 8D:
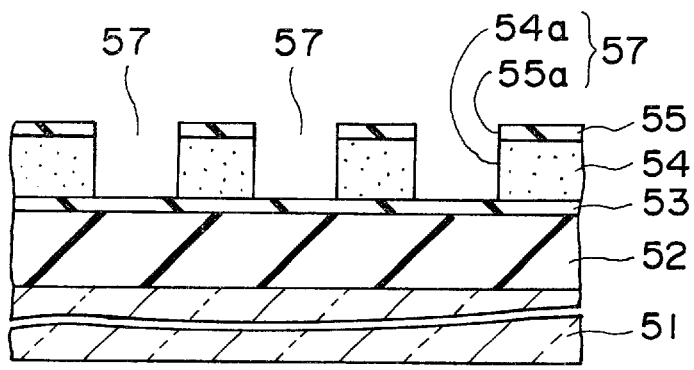

Then, as shown in FIG. 8C, openings 55a are formed by removing a part of the second silicon oxide film 55, which is exposed from the windows 56a, by the plasma etching method using the photoresist 56 as a mask. In turn, as shown in FIG. 8D, openings 54a are formed by removing a part of the first organic insulating film 54 through the openings 55a by the plasma anisotropic etching method. In this case, nitrogen ($N_2$) and hydrogen ($H_2$) are employed as the etching gas of the first organic insulating film 54. According to this etching gas, the photoresist 56 is etched and thus removed at the same time when the first organic insulating film 54 is etched.

A first wiring recess 57 is composed of the opening 55a of the second silicon oxide film 55 and the opening 54a of the first organic insulating film 54.

Figure 8E:
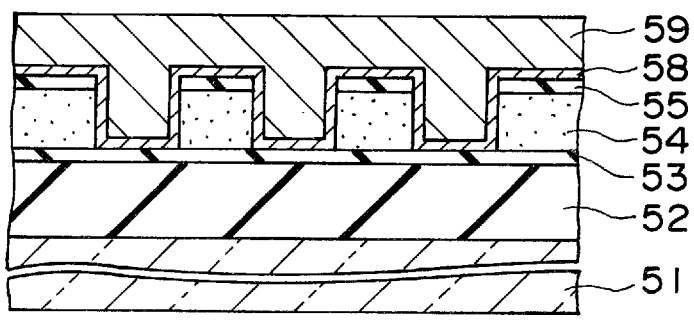

Then, as shown in FIG. 8E, a first barrier metal film 58 is formed by the sputtering in the inside of the first wiring recess 57 and on the upper surface of the second silicon oxide film 55. The first barrier metal film 58 is formed of tantalum nitride (TaN) as a refractory metal and has a thickness of 20 nm. Then, a first copper (Cu) film 59 is formed on the first barrier metal film 58 by the sputtering to have a thickness of 800 nm.

Since unevenness is caused on the upper surface of the first copper film 59, the upper surface is planarized by annealing the first copper film 59 at 400° C. for 15 minutes in the atmosphere of the mixed gas of the nitrogen and the oxygen. After this annealing process, the first copper film 59 can be buried completely in the first wiring recess 57.

Figure 8F:
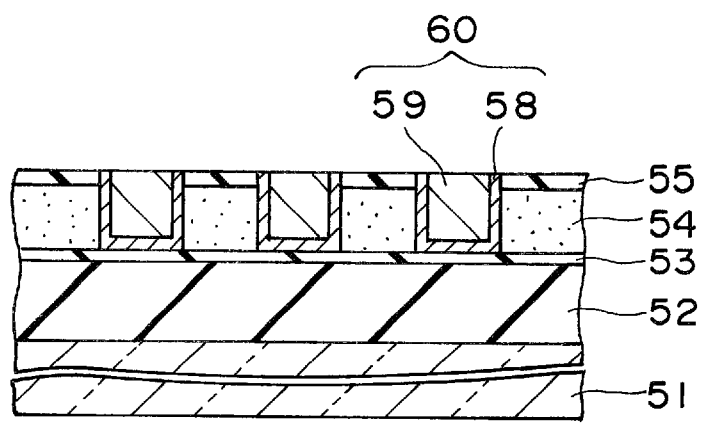

Subsequently, as shown in FIG. 8F, the first copper film 59 and the first barrier metal film 58 are polished by using the chemical mechanical polishing (CMP) method. Thus, the first copper film 59 and the first barrier metal film 58 remain only in the first wiring recess 57, and they are employed as a first wiring 60.

Figure 8G:
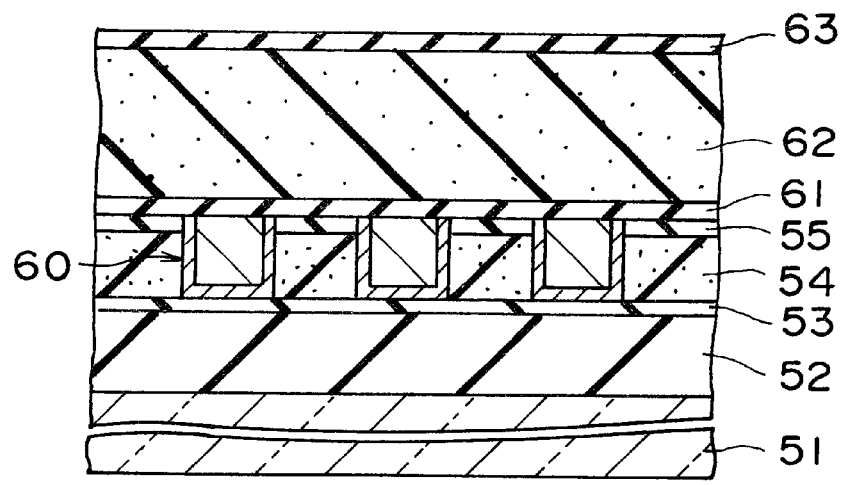

Then, as shown in FIG. 8G, a plurality of insulating film, metal film, etc., to be described in the following, are formed on the first wiring 60 and the second silicon oxide film 55.

First, a second silicon nitride ($Si_3N_4$) film 61 of 50 nm thickness is formed on the first wiring 60 and the second silicon oxide film 55 by the plasma CVD method. Then, a second organic insulating film 62 of about 100 nm thickness is formed on the second silicon nitride film 61. The second organic insulating film 62 is formed by the same method as the first organic insulating film 54 using the insulating material such as "SiLK".

Further, a third silicon oxide film 63 of 100 nm thickness is formed on the second organic insulating film 62 by the plasma CVD method.

Figure 8H:
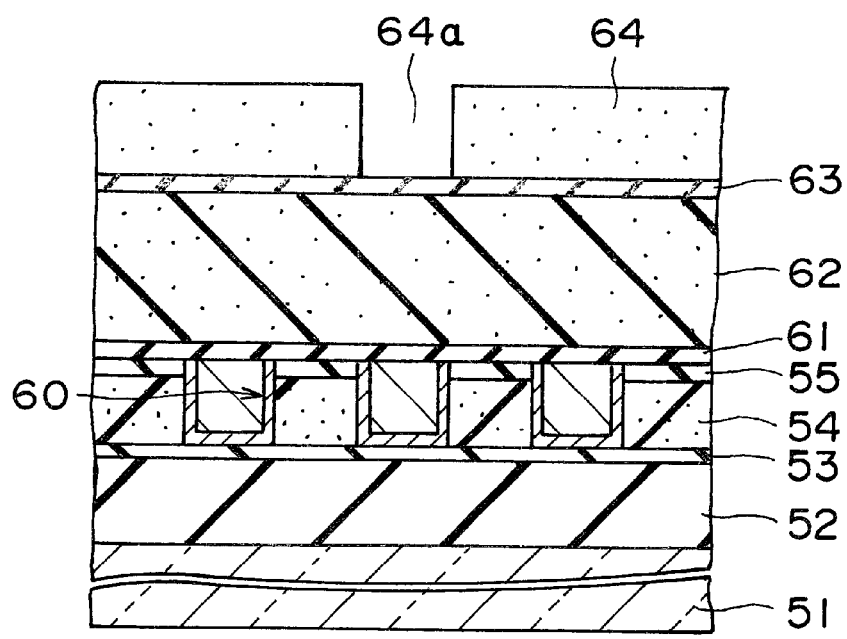

Then, as shown in FIG. 8H, photoresist 64 is coated on the third silicon oxide film 63. A window 64a having a via-hole profile is formed by exposing/developing the photoresist 64.

Figure 8I:
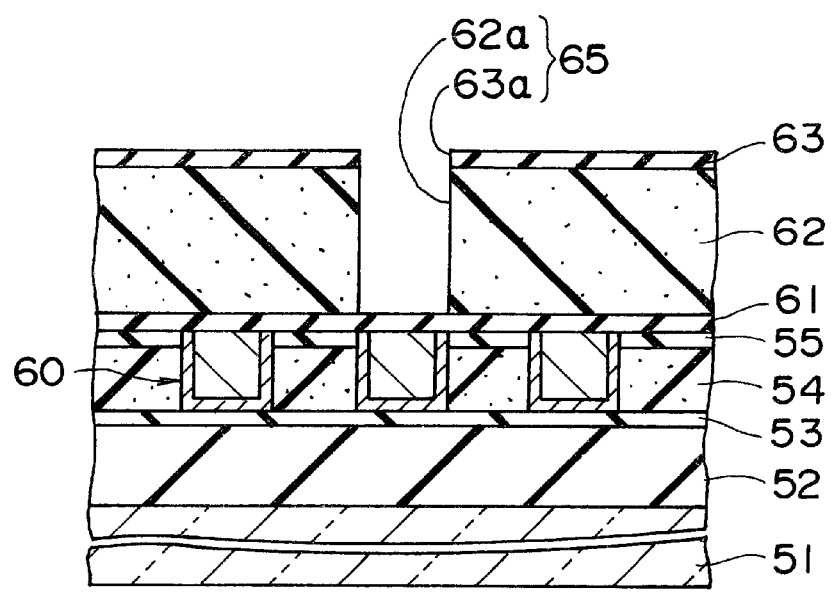

Then, as shown in FIG. 8I, an opening 63a is formed in the third silicon oxide film 63 by removing a part of the third silicon oxide film 63 through the window 64a of the photoresist 64 by the plasma etching method. Next, an opening 62a is formed in the second organic insulating film 62 by etching the second organic insulating film 62 through the opening 63a. The opening 63a of the third silicon oxide film 63 and the opening 62a of the second organic insulating film 62 are used as a contact hole (via-hole) 65.

If the plasma anisotropic etching method is employed by using the mixed gas of the nitrogen and the hydrogen as the etching gas upon etching the second organic insulating film 62, the photoresist 64 can also be etched simultaneously and therefore there is no necessity that the photoresist 64 should be removed by another step. Hence, after the photoresist has been removed, the third silicon oxide film 63 acts as a mask when the second organic insulating film 62 is etched. In other words, the inorganic material film such as the $SiO_2$ film and the $Si_3N_4$ film have the extremely small etching rate if such etching gas is used, and the second organic insulating film 62 is etched at the high selective ratio.

In this case, if the photoresist 64 remains after the etching of the second organic insulating film 62, it may be removed by using the hydroxylamine solvent. The second organic insulating film 62 made of "SiLK" is not etched by the hydroxylamine solvent.

Figure 8J:
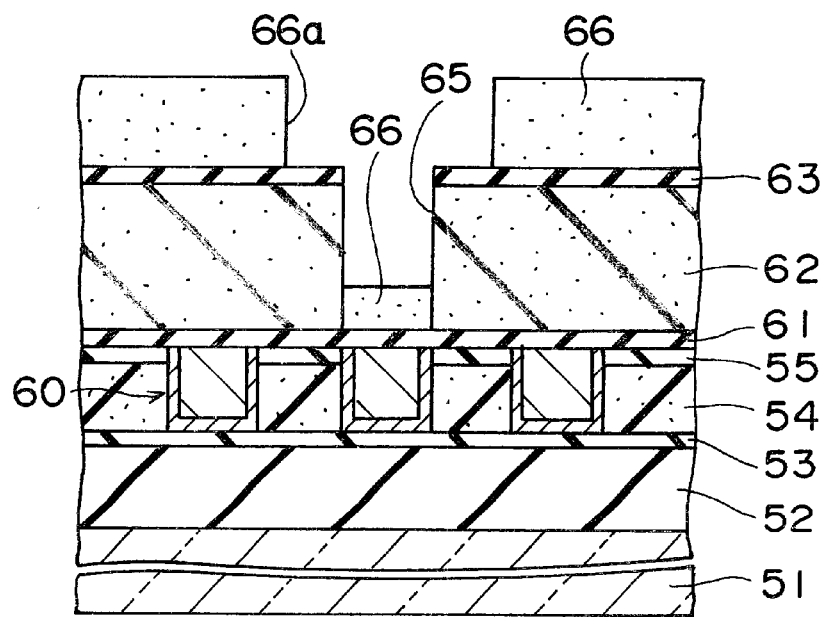

Then, as shown in FIG. 8J, photoresist 66 is coated on the third silicon oxide film 63. A window 66a having a wiring pattern is formed by exposing/developing the photoresist 66. According to the type of the photoresist, the photoresist 66 is accumulated on the bottom of the contact hole 65 after the development, and thus is often difficult to remove. If it is tried to remove the photoresist 66 in the contact hole 65 by the solvent for the photoresist, the photoresist 66 on the third silicon oxide film 63 is simultaneously etched to cause the deformation of the window 66a. Therefore, the photoresist 66 should be removed by using the following steps.

Figure 8K:
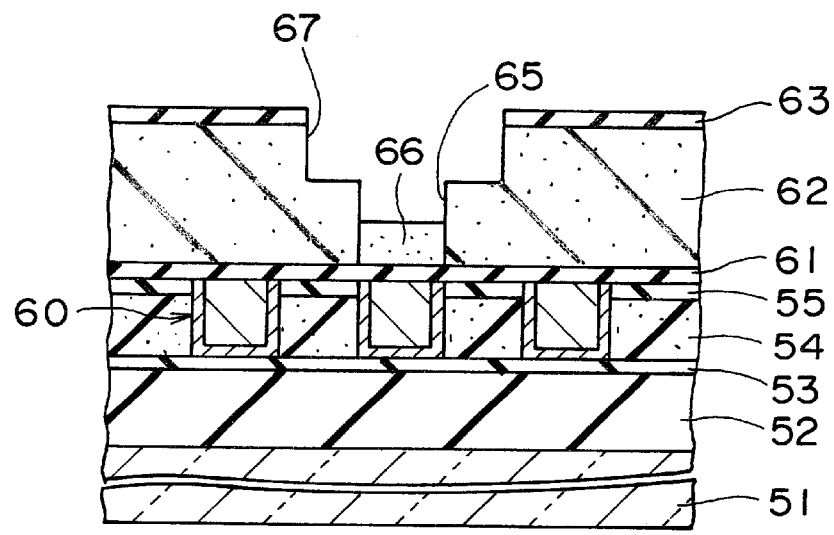

In turn, as shown in FIG. 8K, the third silicon oxide film 63 is etched while using the photoresist 66 as a mask and further the second organic insulating film 62 is etched in the plasma atmosphere until a depth which corresponds to the thickness of the wiring. Accordingly, a second wiring recess 67 is formed on the upper portion of the second organic insulating film 62 through the third silicon oxide film 63. If the hydrogen and the nitrogen are employed as the etching gas of the second organic insulating film 62, as described above, the photoresist 66 is etched simultaneously.

Figure 8L:
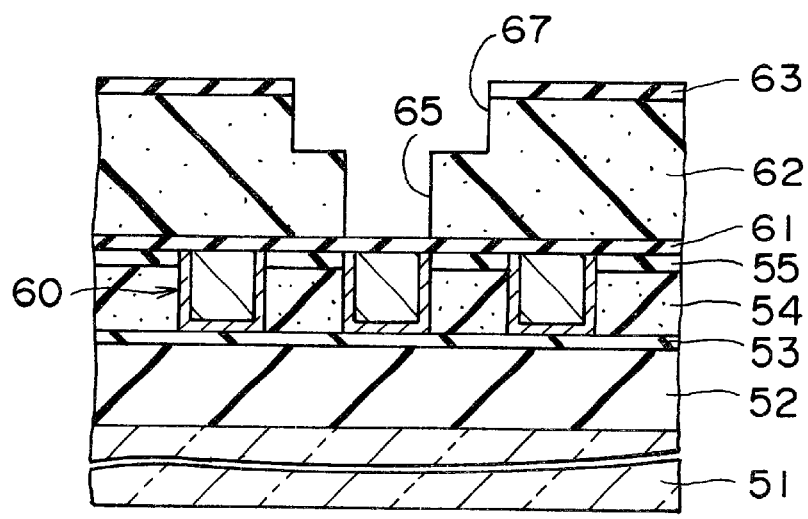

If the photoresist 66 remains on the bottom portion of the contact hole 65 after the second wiring recess 67 has been formed, or if the photoresist 66 remains on the third silicon oxide film 63, such photoresist 66 can be removed by the hydroxylamine good solvent, as shown in FIG. 8L. The photoresist 66 which remains on the bottom of the contact hole 65 has been exposed to the plasma upon etching the second organic insulating film 62, so that the quality of the surface of the photoresist 66 has been improved. Therefore, it is difficult to remove the photoresist 66 by the good solvent for the photoresist, and thus the hydroxylamine good solvent is effective.

Figure 8M:
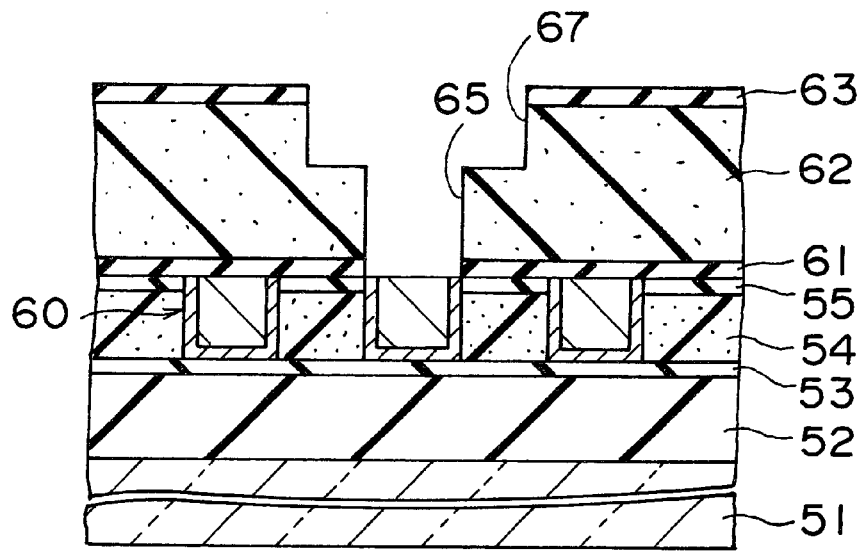

Next, as shown in FIG. 8M, the second $Si_3N_4$ film formed directly below the contact hole 65 is removed by the plasma etching method using $C_4F_8$ and $O_2$, whereby a part of the first wiring 60 can be exposed.

Figure 8N:
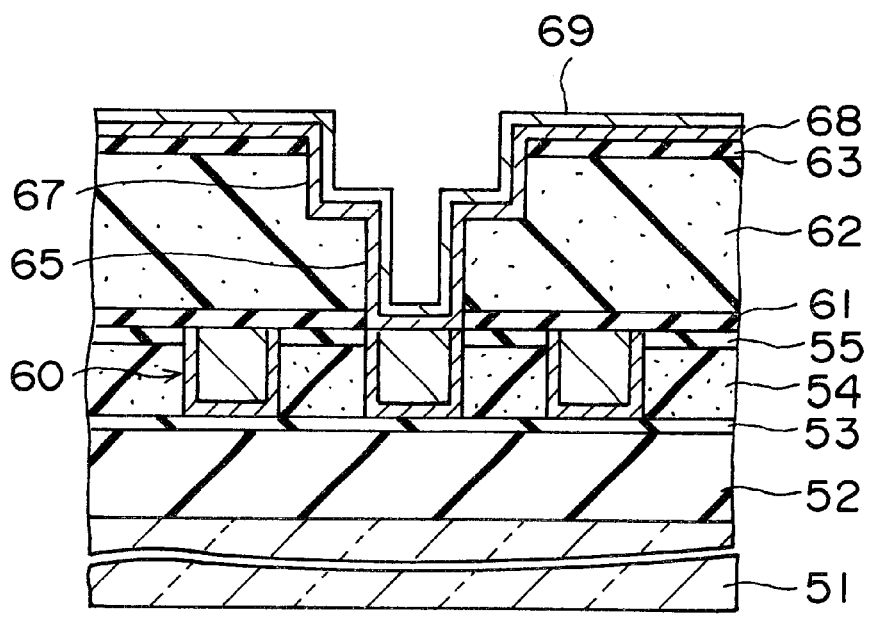

Then, as shown in FIG. 8N, a TaN film 68 of 20 nm thickness is formed as a barrier metal by the sputtering along the inner surfaces of the second wiring recess 67 and the contact hole 65, and the upper surface of the third silicon oxide film 63. Then, a copper seed film 69 of 150 nm thickness is formed on the TaN film 68 by the sputtering.

Figure 8O:
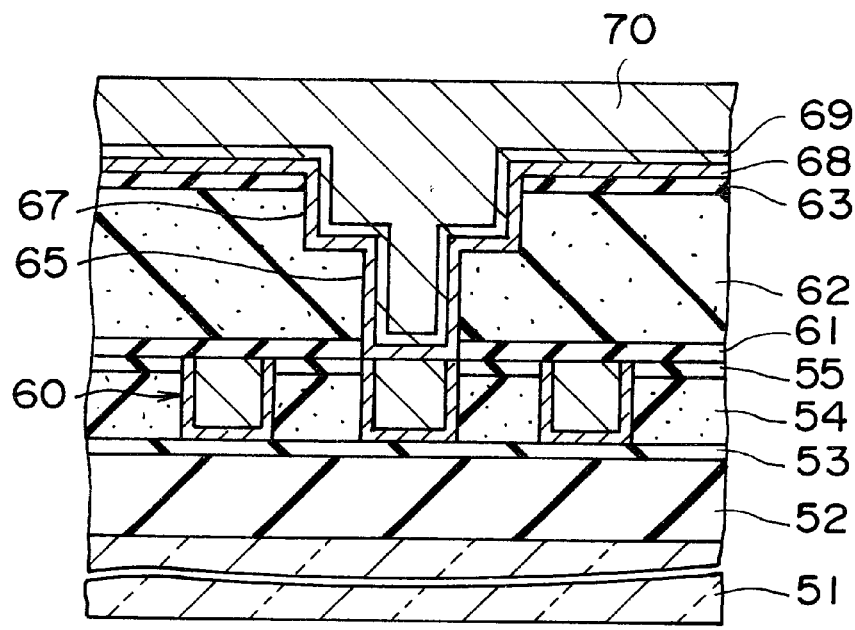
Figure 8P:
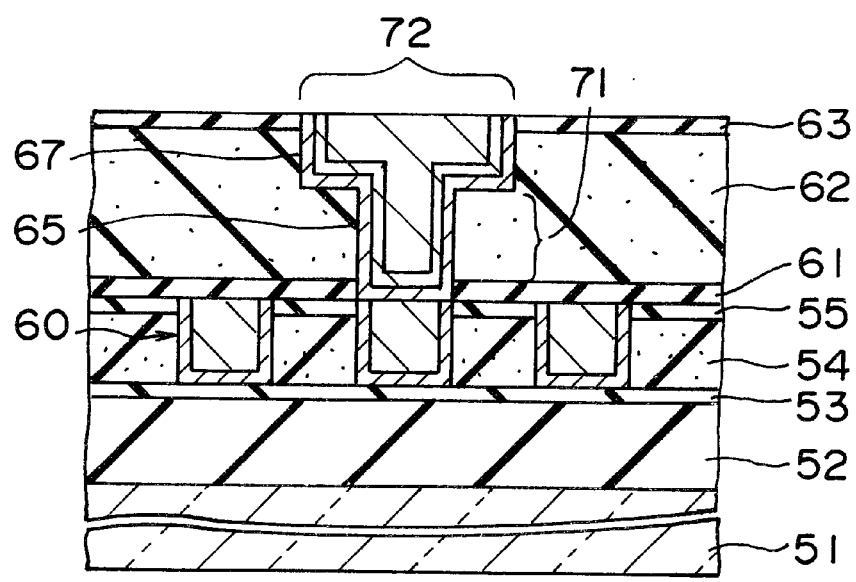

Then, as shown in FIG. 8O, a copper film 70 of 800 nm thickness is formed on the copper seed film 69 by the electrolytic plating method. Then, the copper film 70, the copper seed film 69, and the TaN film 68 which exist on the third silicon oxide film 63 are polished and removed by the CMP method, as shown in FIG. 8P. These metal films which remain in the contact hole 65 after this polishing are used as a plug (via) 71. These metal films which remain in the second wiring recess 67 over the contact hole 65 are applied as a second wiring 72.

As described above, according to the fourth embodiment, since such process which does not need to place the high dielectric constant material, e.g., $SiO_2$, $Si_3N_4$, etc., around the second wiring 72 and the plug 71 is employed, it is possible to reduce effectively the wiring capacitance rather than other dual damascene methods. In addition, since it is not needed to assure independently the step of removing the resist and the number of the insulating films, in which the plug and the second wiring are buried, is reduced rather than the prior art, the number of steps can be reduced.

In the fourth embodiment, the "SiLK" is employed as the low dielectric constant organic insulating films 54, 62. However, other organic insulating film, e.g., "BCB" (product name) manufactured by The Dow Chemical Co., "FLARE" (product name) manufactured by AlliedSignal, or "VELOX" (product name) manufactured by SCHUMACHER may be employed.

As described above, according to the present invention, the inorganic material and the low dielectric constant organic material are employed as the interlayer insulating film. Also, in the multilevel wiring forming steps by the dual damascene method using the copper as the wiring, the opening having the via-hole profile is formed in the underlying organic insulating film while using the uppermost inorganic insulating film as a mask after the opening having the via-hole profile has been formed in the uppermost inorganic insulating film, and then the opening having the wiring profile is formed in the underlying organic insulating film while using the uppermost inorganic insulating film as a mask after the opening having the wiring profile has been formed in the uppermost inorganic insulating film. Therefore, the photoresist which is employed to form the opening in the uppermost inorganic insulating film can be removed at the same time when the opening is formed in the next organic insulating film, and the bad influence upon the opening of the organic insulating film in removing the photoresist can be prevented.

Also, according to the present invention, since the wiring opening formed in the uppermost inorganic insulating film and the via-hole profile formed in the organic insulating film are transferred sequentially onto the insulating films positioned below them, the inorganic insulating film and the organic insulating film which constitute the interlayer insulating film can be etched under their optimum conditions respectively.

Accordingly, if the present invention is employed, effective reduction of the inter-wiring capacitance and the good via contact resistance can be achieved, and also performance and reliability of the semiconductor device can be improved.

Further, according to the present invention, since the via and the wirings are formed in the organic insulating film by the dual damascene method, the wiring capacitance can be reduced effectively rather than the multilevel wiring structure in which the silicon oxide and the silicon nitride are employed. In addition, the exchange number of the etching gas which is employed to form the via-hole and the wiring recess in the insulating film can be reduced, and thus it is possible to form the multilevel wirings at low cost.

What is claimed is:

1. A semiconductor device manufacturing method comprising the steps of:

forming a first insulating film, a first organic insulating film, a second insulating film, and a metal film in sequence over a semiconductor substrate;

forming a first opening having a wiring pattern profile by etching the metal film partially;

forming a second opening having a via pattern profile by etching a portion of the second insulating film which overlaps with a part of the first opening;

forming a third opening having the via pattern profile in the first organic insulating film by etching the first organic insulating film through the second opening using the second insulating film as a mask;

forming a fourth opening having the wiring pattern profile in the second insulating film by etching the second insulating film through the first opening of the metal film, and simultaneously forming a fifth opening having the via pattern profile by etching the first insulating film through the third opening of the first organic insulating film, the fifth opening being applied as the via-hole;

forming a sixth opening having the wiring pattern profile in the first organic insulating film by etching the first organic insulating film through the fourth opening of the second insulating film, the sixth opening and the fourth opening being applied to a wiring recess;

forming a via in the via-hole and forming a wiring in the wiring recess by burying a conductive material simultaneously into the via-hole and the wiring recess; and removing the metal film.

2. A semiconductor device manufacturing method according to claim 1, further comprising the steps of:

forming a third insulating film under the first insulating film; and forming a seventh opening by etching the third insulating film through the fifth opening to use it as a part of the via-hole.

3. A semiconductor device manufacturing method according to claim 2, further comprising the steps of:

forming a second organic insulating film between the first insulating film and the third insulating film; and forming an eighth opening in the second organic insulating film by etching the second organic insulating film through the fifth opening of the first insulating film at a same time when the sixth opening is formed in the first organic insulating film;

wherein the eighth opening, the fifth opening and the seventh opening are applied as the via-hole.

4. A semiconductor device manufacturing method according to claim 1, wherein the conductive film is formed on the second insulating film, and the conductive film on the second insulating film is removed prior to formation of the metal film.

5. A semiconductor device manufacturing method according to claim 1, wherein the first insulating film and the second insulating film are formed of inorganic insulating material.

6. A semiconductor device manufacturing method according to claim 1, wherein the metal film is formed of a refractory metal or a refractory metal compound.

7. A semiconductor device manufacturing method according to claim 1, wherein the conductive film is formed of a double-layered structure consisting of a barrier metal film and a copper film.

8. A semiconductor device manufacturing method according to claim 1, wherein a resist mask is employed in forming the first opening in the metal film, and the resist mask is removed before the second opening is formed.

9. A semiconductor device manufacturing method according to claim 1, wherein a resist mask is employed in forming the second opening in the second insulating film, and the resist mask is etched at a same time when a part of the first organic insulating film is etched to form the third opening.

10. A semiconductor device manufacturing method comprising the steps of:

forming a first insulating film, a first organic insulating film, and a second insulating film in sequence over a semiconductor substrate;

forming a first opening having a via pattern profile by etching the second insulating film partially;

forming a second opening having a via pattern profile in the first organic insulating film by etching the first organic insulating film through the first opening of the second insulating film;

forming a third opening having a wiring pattern profile by etching a portion of the second insulating film which contains the first opening, and simultaneously forming a fourth opening in the first insulating film by etching the first insulating film below the second insulating film through the second opening of the first organic insulating film, the fourth opening being applied as the via-hole;

forming a fifth opening in the first organic insulating film by etching the first organic insulating film through the third opening of the second insulating film, the fifth opening and the third opening being applied to a wiring recess; and forming a via in the via-hole and forming a wiring in the wiring recess by burying a conductive material simultaneously into the via-hole and the wiring recess.

11. A semiconductor device manufacturing method according to claim 10, further comprising the steps of:

forming a third insulating film under the first insulating film; and forming a sixth opening by etching the third insulating film through the fourth opening to use it as a part of the via-hole.

12. A semiconductor device manufacturing method according to claim 11, further comprising the steps of:

forming a second organic insulating film between the first insulating film and the third insulating film; and forming a seventh opening in the second organic insulating film by etching the second organic insulating film through the fourth opening of the first insulating film simultaneously when the fifth opening is formed in the first organic insulating film;

wherein the fourth opening, the sixth opening and the seventh opening are applied as the via-hole.

13. A semiconductor device manufacturing method according to claim 10, wherein the conductive film is formed on the second insulating film, and the conductive film on the second insulating film is removed by a polishing method.

14. A semiconductor device manufacturing method according to claim 10, wherein the first insulating film and the second insulating film are formed of inorganic insulating material.

15. A semiconductor device manufacturing method according to claim 10, wherein the conductive film is formed of a double-layered structure consisting of a barrier metal film and a copper film.

16. A semiconductor device manufacturing method according to claim 10, wherein the first opening of the second insulating film is formed by etching the second insulating film using resist as a mask, and the resist is removed simultaneously when the first insulating film is etched to form the second opening.

17. A semiconductor device manufacturing method comprising the steps of:

forming a first insulating film and a second insulating film in sequence over a semiconductor substrate;

forming a first photoresist including a first window having a via pattern profile on the second insulating film;

forming a first opening having the via pattern profile by etching the second insulating film using the first photoresist as a mask;

forming a second opening having the via pattern profile by etching the first insulating film through the first opening;

forming a second photoresist having a wiring pattern on the second insulating film;

forming a third opening having the wiring pattern by etching the second insulating film using the second photoresist as a mask;

forming a fourth opening having the wiring pattern by etching an upper portion of the first insulating film through the third opening; and forming a wiring in the third opening and the fourth opening and forming a via in the second opening by burying a conductive material into the second opening, the third opening, and the fourth opening.

18. A semiconductor device manufacturing method according to claim 17, wherein the first photoresist is removed by using a hydroxylamine solvent after the second opening has been formed.

19. A semiconductor device manufacturing method according to claim 17, wherein the second photoresist is removed by using a hydroxylamine solvent after the fourth opening has been formed.

20. A semiconductor device manufacturing method according to claim 17, wherein the first insulating film is formed of hydrocarbon insulating material, and the second insulating film is formed of silicon containing insulating material.

21. A semiconductor device manufacturing method according to claim 20, wherein the hydrocarbon insulating material contains aromatic material.

22. A semiconductor device manufacturing method according to claim 20, wherein the silicon containing insulating material is formed of silicon oxide, silicon nitride, silicon oxide nitride, or silicon carbide.

23. A semiconductor device manufacturing method according to claim 20, wherein the second opening is formed by etching the first insulating film simultaneously when the first photoresist is etched.

24. A semiconductor device manufacturing method according to claim 20, wherein the fourth opening is formed by etching the first insulating film simultaneously when the second photoresist is etched.

25. A semiconductor device manufacturing method, comprising the steps of:

forming a first insulating film, a first organic insulating film, a second insulating film, and a mask film in sequence over a semiconductor substrate;

forming a first opening having a wiring pattern profile by etching the mask film partially;

forming a second opening having a via pattern profile by etching a portion of the second insulating film which overlaps with a part of the first opening;

forming a third opening in the first organic insulating film by etching the first organic insulating film through the second opening using the second insulating as a mask;

after forming the third opening, forming a fourth opening in the second insulating film by etching the second insulating film through the first opening of the mask film;

forming a fifth opening having the via pattern profile in the first insulating film by etching the first insulating film through the third opening of the first organic insulating film, the fifth opening being applied to a via-hole;

forming a sixth opening having the wiring pattern profile in the first organic insulating film by etching the first organic insulating film through the fourth opening of the second insulating film, the sixth opening and the fourth opening being applied to a wiring recess; and forming a via in the via-hole and forming a wiring in the wiring recess by burying a conductive material into the via-hole and the wiring recess.

* * * * *